United States Patent
Kawamura et al.

(10) Patent No.: US 12,367,919 B2
(45) Date of Patent: Jul. 22, 2025

(54) WORD LINE DRIVER CIRCUITRY INCLUDING SHARED DRIVER GATES, AND ASSOCIATED METHODS, DEVICES, AND SYSTEMS

(71) Applicant: Micron Technology, Inc., Boise, ID (US)

(72) Inventors: Christopher J. Kawamura, Boise, ID (US); J. Wayne Thompson, Boise, ID (US); Brenton Van Leeuwen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 251 days.

(21) Appl. No.: 17/544,219

(22) Filed: Dec. 7, 2021

(65) Prior Publication Data
US 2023/0178142 A1 Jun. 8, 2023

(51) Int. Cl.
| | |
|---|---|
| *G11C 8/08* | (2006.01) |
| *G11C 8/14* | (2006.01) |
| *G11C 11/408* | (2006.01) |
| *H10B 12/00* | (2023.01) |
| *H10D 89/10* | (2025.01) |

(52) U.S. Cl.
CPC ............ *G11C 11/4085* (2013.01); *G11C 8/14* (2013.01); *G11C 8/08* (2013.01); *H10B 12/50* (2023.02); *H10D 89/10* (2025.01)

(58) Field of Classification Search
CPC ......... G11C 11/4085; G11C 8/14; G11C 8/08; H01L 27/0207; H10B 12/50
See application file for complete search history.

(56) References Cited

U.S. PATENT DOCUMENTS

| | | | | |
|---|---|---|---|---|
| 5,986,966 A * | 11/1999 | Nagata | ...................... | G11C 8/08 365/230.06 |
| 6,118,723 A * | 9/2000 | Agata | ...................... | G11C 8/14 365/230.06 |
| 2015/0055394 A1* | 2/2015 | Iwasa | ..................... | H10B 12/50 257/334 |
| 2015/0098260 A1* | 4/2015 | Ohgami | .................... | G11C 8/14 365/51 |
| 2021/0057009 A1* | 2/2021 | Kim | .......................... | G11C 8/08 |
| 2021/0090625 A1* | 3/2021 | Ingalls | ..................... | G11C 8/08 |
| 2023/0197140 A1* | 6/2023 | Van Leeuwen | ........ | G11C 8/08 365/230.06 |

* cited by examiner

*Primary Examiner* — Mushfique Siddique
(74) *Attorney, Agent, or Firm* — TraskBritt

(57) ABSTRACT

Memory devices are disclosed. A device may include a number of word line drivers, wherein each word line driver of the number of word line drivers including a first transistor and a second transistor. The device may also include a number of first driver gates, wherein the first transistor of each word line driver has a gate coupled to a dedicated first driver gate of the number of driver gates. Further, the device may include a second driver gate coupled to a gate of each second transistor of each of the number of word line drivers. Associated circuits, methods, and systems are also disclosed.

18 Claims, 17 Drawing Sheets

| Half Layout | | | | Half Layout | | |
|---|---|---|---|---|---|---|
| Pup Source | Pup Nmos | Pdn Nmos | | Pup Source | Pup Nmos | Pdn Nmos |
| MWL3 | FXT2 | FXFC | | MWL3 | FXT3 | FXFD |
| MWL3 | FXT0 | FXFA | | MWL3 | FXT1 | FXFB |
| MWL2 | FXT1 | FXFC | | MWL2 | FXT0 | FXFD |
| MWL2 | FXT2 | FXFE | | MWL2 | FXT3 | FXFA |
| MWL2 | FXT2 | FXFC | | MWL2 | FXT3 | FXFD |
| MWL2 | FXT0 | FXFA | | MWL1 | FXT1 | FXFB |
| MWL1 | FXT1 | FXFC | | MWL1 | FXT0 | FXFD |
| MWL1 | FXT2 | FXFE | | MWL1 | FXT3 | FXFA |
| MWL1 | FXT2 | FXFC | | MWL1 | FXT3 | FXFD |
| MWL1 | FXT0 | FXFA | | MWL0 | FXT1 | FXFB |
| MWL0 | FXT1 | FXFC | | MWL0 | FXT0 | FXFD |
| MWL0 | FXT2 | FXFE | | MWL0 | FXT3 | FXFA |
| MWL0 | FXT2 | FXFC | | MWL0 | FXT3 | FXFD |
| MWL0 | FXT0 | FXFA | | MWL0 | FXT1 | FXFB |

BWL27, BWL26, BWL25, BWL24, BWL23, BWL22, BWL21, BWL20, BWL19, BWL18, BWL17, BWL16, BWL15, BWL14, BWL13, BWL12, BWL11, BWL10, BWL9, BWL8, BWL7, BWL6, BWL5, BWL4, BWL3, BWL2, BWL1, BWL0

FIG. 5

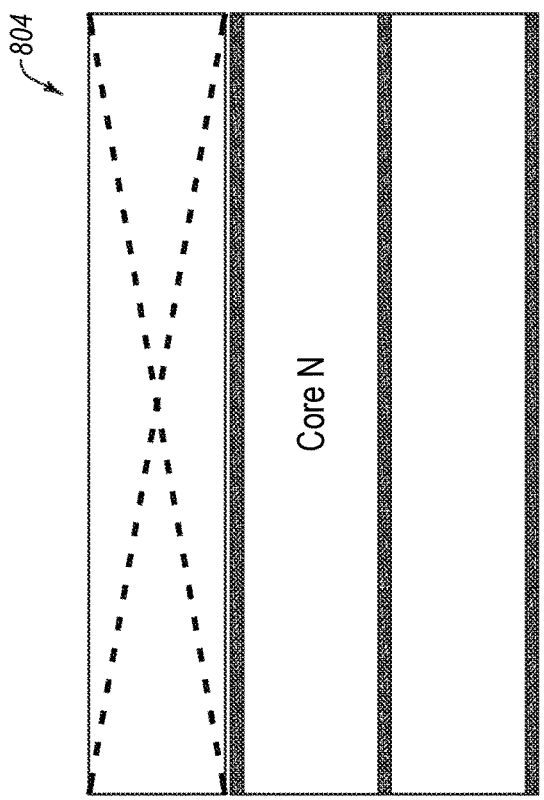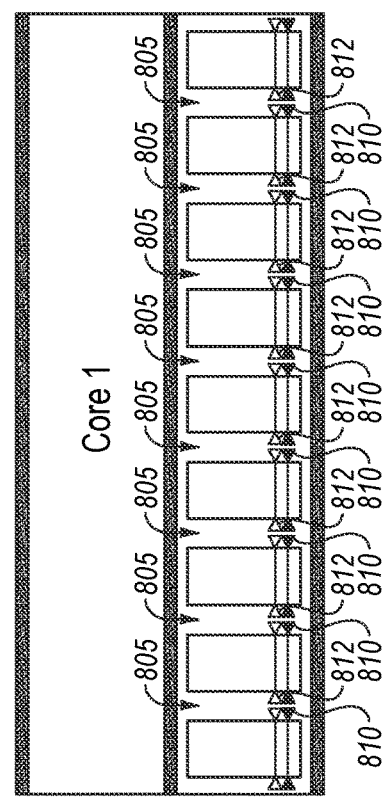
FIG. 8B
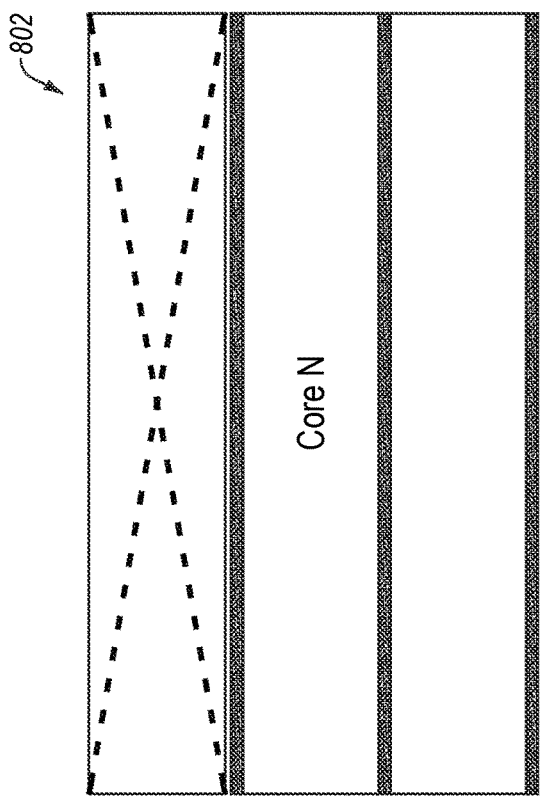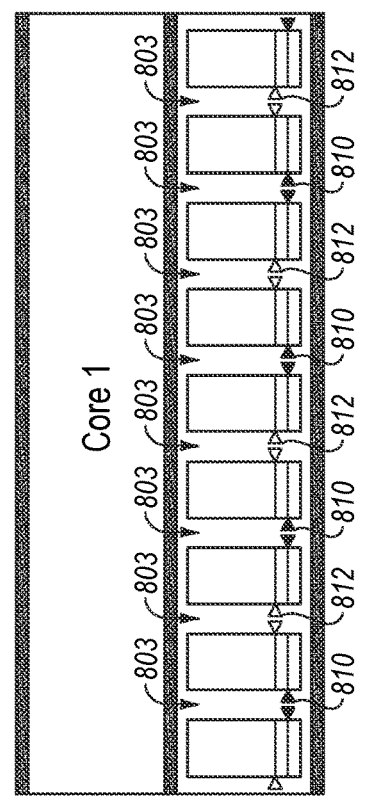
FIG. 8A

WORD LINE DRIVER CIRCUITRY INCLUDING SHARED DRIVER GATES, AND ASSOCIATED METHODS, DEVICES, AND SYSTEMS

TECHNICAL FIELD

Embodiments of the disclosure relate to word line drivers. More specifically, various embodiments relate to word line driver circuitry including shared driver gates, word line driver layouts, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

BRIEF DESCRIPTION OF THE DRAWINGS

FIG. 5 illustrates an example relationship between a number of word lines and driver gates, in accordance with various embodiments of the disclosure.

FIG. 8A depicts a conventional sub word line driver array.

FIG. 8B depicts a word line driver array, according to various embodiments of the disclosure.

DETAILED DESCRIPTION

Figure 1:
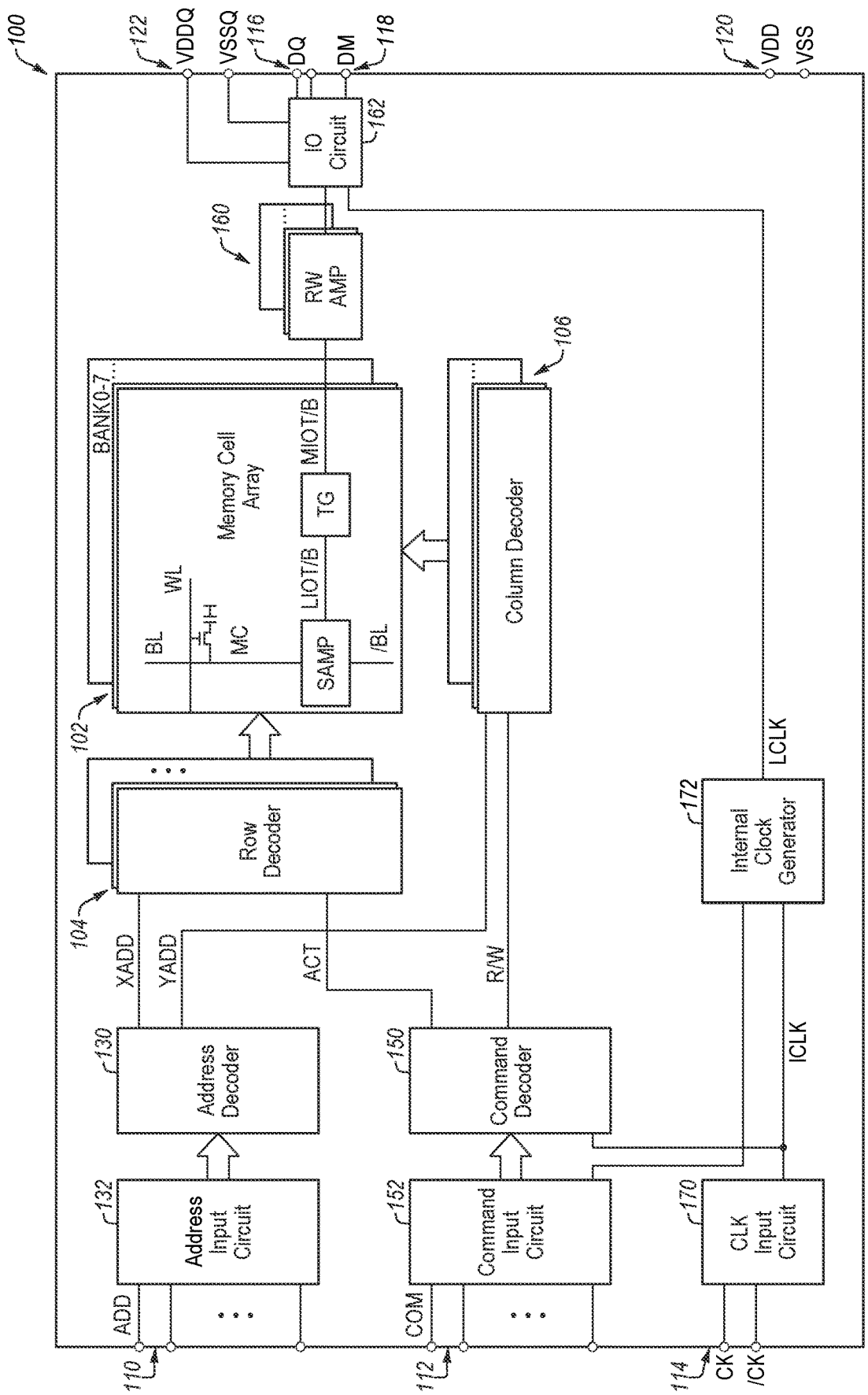
FIG. 1 is a block diagram of an example memory device, according to various embodiments of the present disclosure.

Memory typically includes many memory cells arranged in a two-dimensional array of intersecting rows and columns. Data is written to or retrieved from the memory cells by selectively by applying activation voltages to word lines (i.e., access lines) and bit lines (i.e., data lines). In general, word lines activate memory cells and bit lines provide data to or retrieve data from the activated memory cells.

When memory access is desired, an activation voltage may be applied to a word line by a word line driver to enable a desired function (e.g., read or write) to be performed. More particularly, when an activation voltage (e.g., a high voltage) is applied via a word line, circuitry (e.g., a passgate transistor) in a memory cell may enable a bit line to write data to or retrieve data from the activated memory cell. When memory access is not needed, the word line driver may apply a deactivation voltage (e.g., a low voltage or ground voltage).

In some conventional devices, back-to-back N-channel metal-oxide semiconductor (NMOS) sub word line driver (SWD) layouts require sixteen (16) driver gates (e.g., poly gates) including "keeper" gates (also referred to herein as "FXF gates" or "FXF keeper gates") that individually short each word line to a negative word line voltage (VNWL).

In various embodiments described herein, a gate count (e.g., a number of poly gates) included in word line driver layouts (e.g., sub word line driver layouts) may be reduced compared to conventional devices. More specifically, for example, in at least some embodiments, compared to conventional back-to-back NMOS sub word line driver (SWD) layouts, which require sixteen (16) driver gates (e.g., poly gates), various embodiments disclosed herein may include a word line driver layout including thirteen (13) driver gates. More specifically, at least some "keeper" gates may be shared by a number of word line drivers of a layout (e.g., reducing a keeper gate count for a layout from eight (8) to five (5), and reducing a total gate count for the layout from sixteen (16) to thirteen (13)). In these embodiments, keeper gates may be configured to short at least some inactive word lines to each other (e.g., at negative word line voltage VNWL). Thus, adjacent word line coupling may be reduced, and possibly prevented, by loading down adjacent word lines. Further, according to some embodiments, negative word line voltage (VNWL) may be supplied at an end of a bank of word line drivers (e.g., negative word line voltage VNWL may be coupled to the last sub word line driver in a bank of sub word line drivers). In some embodiments, negative word line voltage VNWL may be supplied at or near a layout area (e.g., a minigap) between a sub word line driver and a sense amp.

More specifically, according to various embodiments disclosed herein, a word line driver circuit (e.g., a sub word line driver circuit (also referred to as a "local word line driver circuit")) may include a number of word line drivers (e.g., a number of sub word line drivers (also referred to as a "local word line drivers")), wherein each word line driver of the number of word line drivers includes a first transistor and a second transistor. Further, the word line driver circuit may include a number of first driver gates, wherein the first transistor of each word line driver is coupled to a dedicated first driver gate of the number of first driver gates. Moreover, the word line driver circuit may include a second driver gate coupled to the second transistor of each of the number of word line drivers. Moreover, in accordance with some embodiments, a method of operating a memory device may include conveying, during a first mode (e.g., an active mode), a first driver signal via a first driver gate to a word line driver of a number of word line drivers. Further, the method may include conveying, during a second mode (e.g., an inactive mode), a second driver signal via a second driver gate to each of the number of word line drivers such that a number of word lines associated with the number of word line drivers couple together and to a common voltage source (e.g., negative word line voltage VNWL).

Further, in at least some embodiments described more fully below, compared to an SWD (e.g., an even or an odd gap NMOS SWD), which may include, for example, eight (8) driver gates (i.e., including four (4) phase gates and four (4) phase bar gates), various embodiments disclosed herein may include, for example, seven (7) driver gates (i.e., including four (4) phase gates and three (3) phase bar, wherein one (1) phase bar gate is shared by multiple word line drivers). In these and other embodiments, a device may include a first word line driver configured to drive a first word line and a second word line driver configured to drive a second word line. The device may also include a first driver gate coupled to the first word line driver and configured to convey a first driver signal to couple the first word line to a first main word line. The device may further include a second driver gate coupled to the second word line driver and configured to convey a second driver signal to couple the second word line to a second main word line. Further, the device may include a third driver gate coupled to each of the first word line driver and the second word line driver and configured to convey a third driver signal to couple each of the first word line and the second word line to a common voltage source.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now explained with reference to the accompanying drawings.

FIG. 1 includes a block diagram of an example memory device 100, according to various embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 160 over complementary local data lines (LIOT/B), transfer gate (TG), and complementary main data lines (MIOT/B). Conversely, write data outputted from read/write amplifiers 160 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 160, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 160, transfer gate TG, and sense amplifier SAMP. The write data may be written to memory cell MC specified by row address XADD and column address YADD.

Clock signals CK and /CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Figure 2:
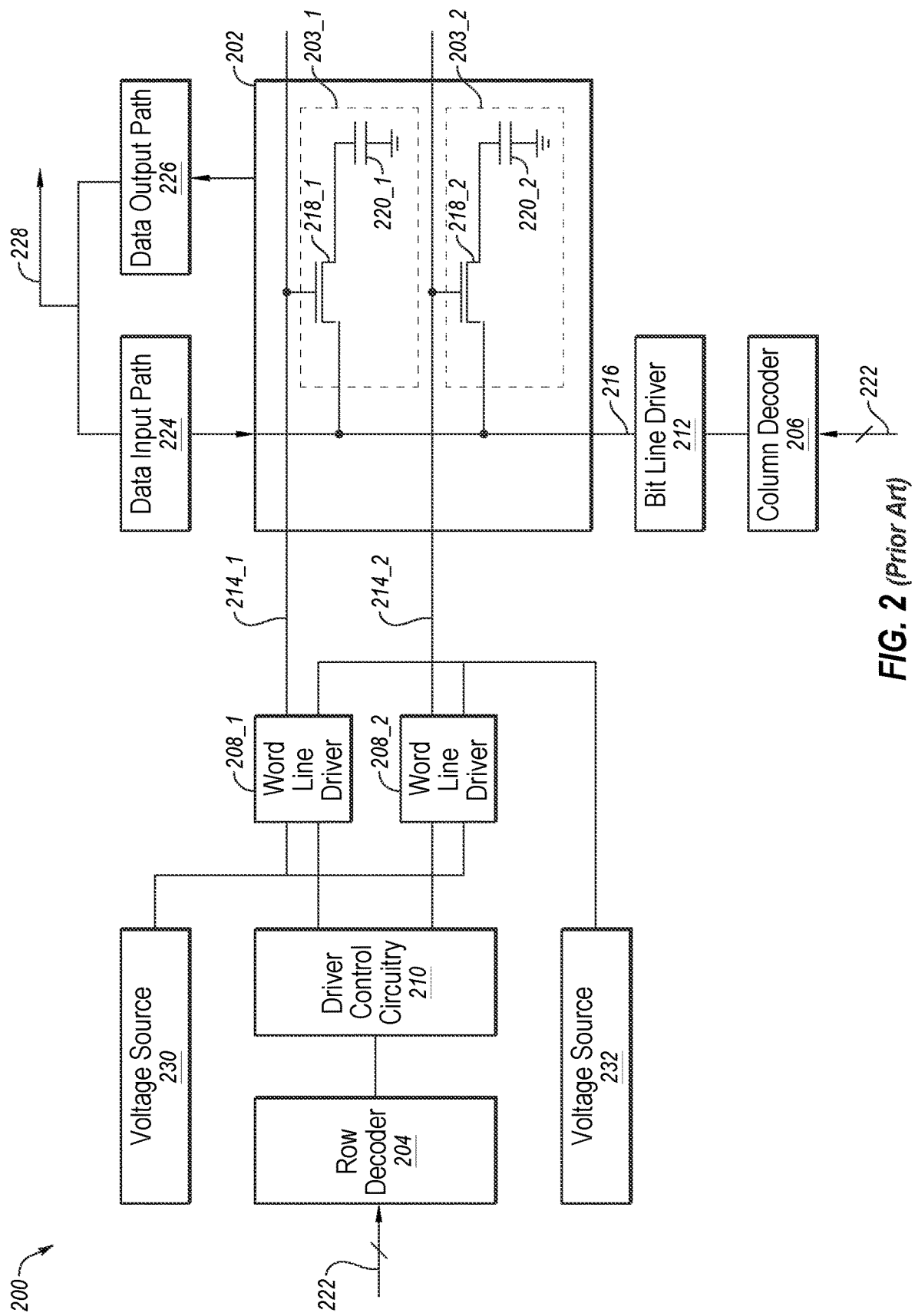
FIG. 2 is another, more specific block diagram of an example memory device, according to various embodiments of the present disclosure.

FIG. 2 depicts another, more specific block diagram of an example memory device 200, according to various embodiments of the present disclosure. Memory device 200, which may be part of memory device 100 of FIG. 1, includes a memory cell array 202 (e.g., memory cell array 102 of FIG. 1) with memory cells 203 arranged side-by-side, a row decoder 204 (e.g., row decoder 104 of FIG. 1) and a column decoder 206 (e.g., column decoder 106 of FIG. 1). Memory device 200 further includes word line driver circuitry including word line drivers 208 and driver control circuitry 210. Memory device 200 also includes a bit line driver 212. Memory device 200 further includes word lines 214 and a bit line 216 disposed adjacent to the rows and columns of memory cells 203.

It is understood that a memory array (e.g., memory cell array 202 in FIG. 2) typically includes a number of memory cells arranged in rows and columns; however, for simplicity, only two such memory cells (i.e., memory cells 203_1 and memory cell 203_2) are shown in FIG. 2. Similarly, it will be understood that a memory device (e.g., memory device 200) may generally include any number of word line drivers, any number of word lines, and any number bit lines; however, for simplicity, only two word line drivers (e.g., word line driver 208_1 and word line driver 208_2), two word lines (i.e., word line 214_1 and word line 214_2) and one bit line (i.e., bit line 216) are shown in FIG. 2.

As will be appreciated, each memory cell 203 includes a passgate transistor 218 having its gate connected to an associated word line 214, its drain connected to bit line 216, and its source connected to an associated capacitor 220. Each word line 214 is driven by an associated word line driver 208 and each bit line 216 is driven by bit line driver 212.

Row decoder 204 and a column decoder 206 may be configured to decode address signals on address lines 222 to access memory cells 203. Data may be provided to memory cells 203 via a data input path 224, and data may be retrieved from memory cells 203 via a data output path 226. Data being transmitted to and from data input path 224 and data output path 226 may be carried on data lines 228.

Each word line driver 208 may be controlled by driver control circuitry 210, which may receive signals (i.e., from row decoder 204) that indicate which word line drivers 208 should apply activation voltages to word lines 214, and which word line drivers 208 should apply deactivation voltages to word lines 214.

According to some embodiments, in an active mode (e.g., also referred to herein as a "row active mode," an "active phase," or an "active period"), driver control circuitry 210 conveys a high (e.g., a logic high state) signal to word line driver 208_1, and word line driver 208_1 may apply an activation voltage to word line 214_1 (and any other word lines that word line driver 208_1 is driving). The activation voltage (e.g., a supply voltage Vccp) may be provided by a voltage source 230 (also be referred to herein as a "high voltage source"), which is coupled to word line driver 208_1. The activation voltage may be applied to word line 214_1 to perform a memory access function (e.g., read or write function) on associated memory cell 203_1. More specifically, for example, the activation voltage may activate passgate transistor 218_1 to enable data transfer between memory cell 203_1 and data paths 224 and 226.

In an inactive mode (also referred to herein as a "standby phase," a "pre-charge mode" or a "pre-charge phase") (e.g., when no memory access function is being performed), word line driver 208_1 may apply a deactivation voltage to word line 214_1. The deactivation voltage (e.g., a ground voltage or a negative voltage) may be provided by a voltage source 232 (also be referred to herein as a "low voltage source"), which is coupled to word line driver 208_1. The application of a deactivation voltage may turn passgate transistor 218_1 OFF, thereby preventing any memory access function from being performed on memory cell 203_1.

Alternatively, in some embodiments, driver control circuitry 210 may cause word line driver 208_1 to apply an activation voltage (i.e., provided by voltage source 232) to word line 214_1. As such, the activation voltage (e.g., a ground voltage, low positive voltage, or a negative voltage) may activate passgate transistor 218_1 (e.g., a PMOS transistor) to enable data transfer between memory cell 203_1 and data paths 224 and 226. Additionally, in some embodiments, driver control circuitry 210 may cause word line driver 208_1 to apply a deactivation voltage (i.e., provided by voltage source 230) to word line 214_1. As such, the deactivation voltage (e.g., voltage Vccp) may turn passgate transistor 218_1 OFF, thereby preventing any memory access function from being performed on memory cell 203.

Figure 3:
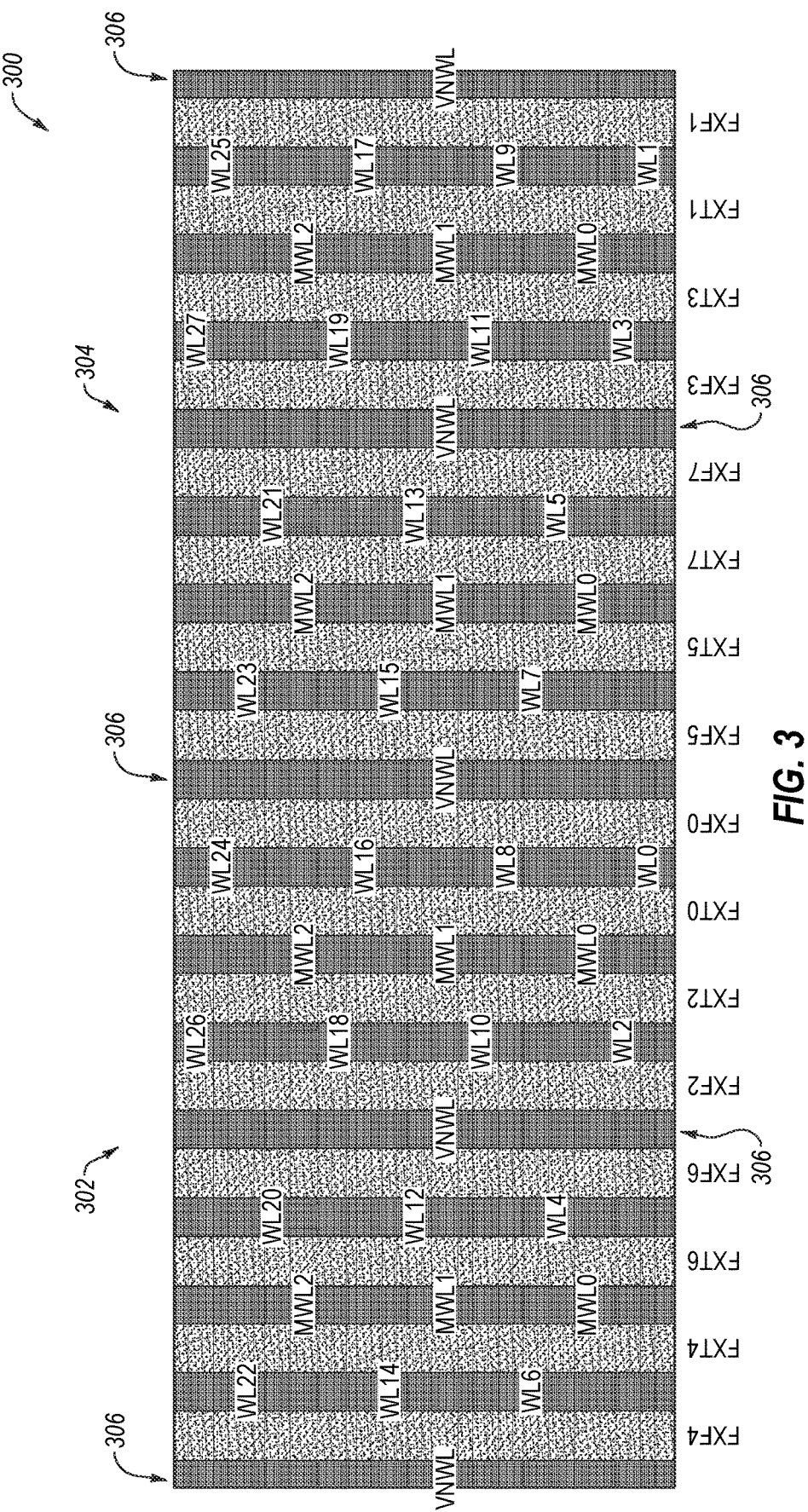
FIG. 3 depicts a word line driver layout of a conventional memory device.

FIG. 3 depicts a sub word line driver (SWD) layout 300 of a conventional memory device. Layout 300 includes back-to-back SWD layouts 302 and 304 for driving even and odd word lines. Each SWD layout 302/304 includes eight (8) driver gates, and SWD layout 302 includes fourteen (14) word lines (i.e., even-numbered word lines WL0, WL2, WL4, . . . WL26) and SWD layout 304 includes fourteen (14) word lines (i.e., odd-numbered word lines WL1, WL3, WL5, . . . WL27). Layout 300 also includes a number of main word lines (i.e., MWL0-MWL2) and a number of areas 306 for supplying negative word line voltage VNWL. Further, FIG. 3 depicts driver gates FXF and FXT (i.e., eight (8) FXF driver gates and eight (8) FXT driver gates), which may be used to convey driver signals to transistors of layout 300.

As will be appreciated, in conventional devices, two driver gates (i.e., FXF and FXT driver gates) are needed to drive a word line for each gap of layout 300 (i.e., an area positioned between two array MATs). More specifically, to drive a single word line, dedicated FXF and FXT driver gates are used. Yet more specifically, to turn the word line ON (i.e., to drive the word line HIGH), a dedicated driver gate FXT is used to convey a driver signal to a gate of a first transistor (i.e., a pull-up transistor) of an associated word line driver to couple the word line to a high voltage source. Further, to turn the word line OFF (i.e., to drive the word line LOW), a dedicated driver gate FXF (also referred to herein as a "keeper gate") is used to convey a driver signal to a gate of a second transistor (i.e., a pull-down transistor) of the associated word line driver to couple the word line to a low voltage source (i.e., negative word line voltage VNWL).

In contrast to conventional devices, according to various embodiments of the disclosure, a single FXF driver gate (i.e., a single keeper gate) may be shared by multiple word line drivers. In other words, at least some gates (e.g., "keeper gates") of word line driver layout may be shared by multiple word line drivers (e.g., of a word line driver chain (also referred to herein as a "word line driver bank")). Further, in these embodiments, one end of a word line driver chain (i.e., including multiple word line drivers) may be coupled to a low voltage source (e.g., negative word line voltage VNWL), and in response to a driver signal (i.e., conveyed via an FXF driver gate), a number of word lines associated with the word line driver chain may be coupled together and to a common voltage source (e.g., negative word line voltage VNWL). Thus, compared to conventional word line driver layouts, a number of gates (e.g., a number of poly gates) may be reduced (e.g., from sixteen (16) driver gates to thirteen (13) driver gates).

Figure 4:
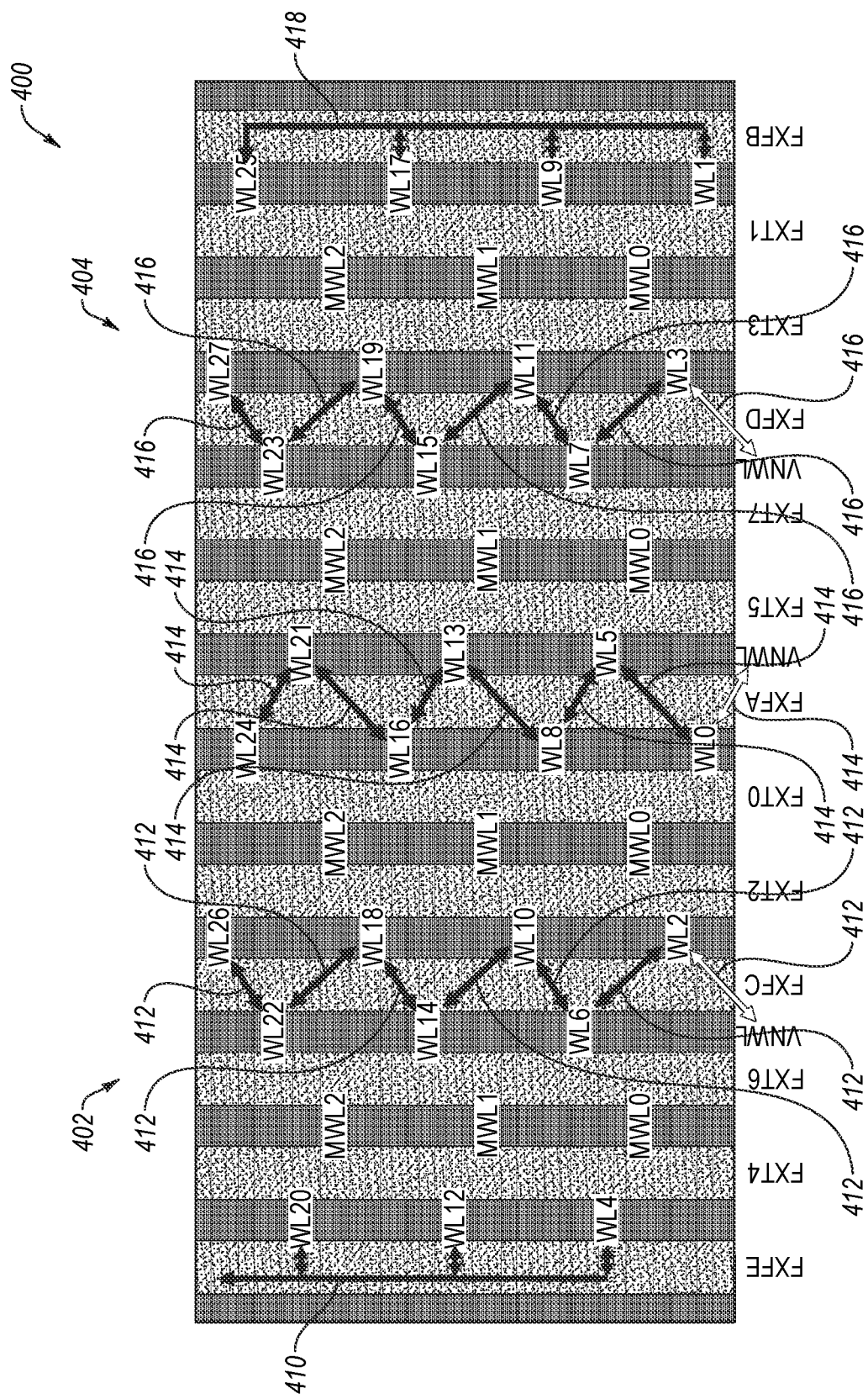
FIG. 4 depicts a word line driver layout, according to various embodiments of the disclosure.

FIG. 4 depicts a layout 400 of word line driver circuitry (e.g., sub word line driver (SWD) circuitry) including a number of word lines, according to various embodiments of the disclosure. Layout 400, which may be part of a memory device (e.g., memory device 100 of FIG. 1), includes an area 402 including fourteen (14) word lines (i.e., even-numbered word lines WL0, WL2, WL4 . . . WL26) and an area 404 includes fourteen (14) word lines (i.e., odd-numbered word lines WL1, WL3, WL5 . . . WL27). Further, layout 400 includes a number of main word lines (also referred to herein as "global word lines") (i.e., MWL0-MWL2). Layout 400 further depicts driver gates FXF and FXT (e.g., poly gates), which may be used to convey driver signals to word line drivers of layout 400.

In comparison to layout 300 of FIG. 3, which includes sixteen (16) driver gates (i.e., eight (8) FXT driver gates and eight (8) FXF driver gates), layout 400 includes thirteen (13) driver gates (i.e., eight (8) FXT driver gates and five (5) FXF driver gates). More specifically, area 402 includes three FXF gates (i.e., FXFE, FXFC, and FXFA) and four FXT gates (i.e., FXT4, FXT6, FXT2, and FXT0), and area 404 includes three FXF gates (i.e., FXFB, FXFD, and FXFA) and four FXT gates (i.e., FXT1, FXT3, FXT7, and FXT5). It is noted that gate FXFA is shared by areas 402 and 404. In other words, a driver signal conveyed via gate FXFA may be received by word line drivers of area 402 and word line drivers of area 404. Accordingly, compared to layout 300, layout 400 includes a reduced number of driver gates, and thus a size of an associated memory device may be reduced.

In the embodiment illustrated in FIG. 4, driver gate FXFE may be coupled to word line driver circuitry (e.g., a pull-down NMOS transistor) for each of word line WL<4>, word line WL<12>, and word line WL<20>. Thus, in this example, word line WL<4>, word line WL<12>, and word line WL<20> may be part of a word line driver chain, as indicated by arrows 410. According to various embodiments, at least one word line driver associated with the chain may be configured to couple the chain of word lines to a voltage source (e.g., negative word line voltage VNWL) (e.g., during an inactive mode). For example, the voltage source (e.g., negative word line voltage VNWL) may be positioned at at least one end of the word line driver chain including word line WL<4>, word line WL<12>, and word line WL<20>.

Further, driver gate FXFC may be coupled to word line driver circuitry (e.g., a pull-down NMOS transistors) for each of word line WL<2>, word line WL<6>, word line WL<10>, word line WL<14>, word line WL<18>, word line WL<22>, and word line WL<26>. Thus, in this example, word line WL<2>, word line WL<6>, word line WL<10>, word line WL<14>, word line WL<18>, word line WL<22>, and word line WL<26> may be part of a word line driver chain, as indicated by arrows 412. According to various embodiments, the last word line driver in the chain may be coupled to a source voltage (e.g., the unshaded arrow 412 extending from WL<2> and near the bottom of FIG. 4 may indicate a connection to the source voltage (e.g., negative word line voltage VNWL)).

Moreover, driver gate FXFA may be coupled to word line driver circuitry (e.g., a pull-down NMOS transistor) for each of word line WL<0>, word line WL<5>, word line WL<8>, word line WL<13>, word line WL<16>, word line WL<21>, and word line WL<24>. Thus, in this example, word line WL<0>, word line WL<5>, word line WL<8>, word line WL<13>, word line WL<16>, word line WL<21>, and word line WL<24> may be part of a word line driver chain, as indicated by arrows 414. According to various embodiments, the last word line driver in the chain may be coupled to a source voltage (e.g., the unshaded arrow 414 extending from WL<0> and near the bottom of FIG. 4 may indicate a connection to the source voltage (e.g., negative word line voltage VNWL)).

Further, driver gate FXFD may be coupled to word line driver circuitry (e.g., a pull-down NMOS transistor) for each of word line WL<3>, word line WL<7>, word line WL<11>, word line WL<15>, word line WL<19>, word line WL<23>, and word line WL<27>. Thus, in this example, word line WL<3>, word line WL<7>, word line WL<11>, word line WL<15>, word line WL<19>, word line WL<23>, and word line WL<27> may be part of a word line driver chain, as indicated by arrows 416. According to various embodiments, the last word line driver in the chain may be coupled to a source voltage (e.g., the unshaded arrow 416 extending from WL<3> and near the bottom of FIG. 4 may indicate a connection to the source voltage (e.g., VNWL)).

In addition, driver gate FXFB may be coupled to word line driver circuitry (e.g., a pull-down NMOS transistor) for each of word line WL<1>, word line WL<9>, word line WL<17>, and word line WL<25>. Thus, in this example, word line WL<1>, word line WL<9>, word line WL<17>, and word line WL<25> may be part of a word line driver chain, as indicated by arrows 418. According to various embodiments, at least one word line driver associated with the chain may be configured to couple the chain of word lines to the source voltage (e.g., negative word line voltage VNWL). For example, the voltage source (e.g., negative word line voltage VNWL) may be positioned at at least one end of the word line driver chain including word line WL<1>, word line WL<9>, word line WL<17>, and word line WL<25>.

According to some embodiments, during a contemplated operation of layout 400, each of driver gates FXFA, FXFB, FXFC, FXFD, and FXFE may be HIGH (e.g., at voltage VCC), except when an adjacent FXT gate is HIGH (e.g., at voltage VCCP2). This may ensure that, in at least some scenarios, each word line is shunted to each other. Further, according to at least some embodiments, in contrast to layout 300 of FIG. 3, layout 400 may not include negative word line voltage VNWL connections at the edges of layout 400 (left and right vertical edges in FIG. 4), and thus an active area at one or more of the edges may not be necessary in layout 400. Thus, a size of layout 400 may be less than a size of conventional layouts, such as layout 300.

It is noted that although the word line driver chains shown in FIG. 4 includes a specific number of word line drivers, the disclosure is not so limited and each word line driver chain of a layout may include any number of word line drivers. Moreover, according to some embodiments, layout 400 may include one or more active areas adjacent (e.g., underneath (i.e., into the page)) a chain of word line drivers. More specifically, for example, an active area may be positioned adjacent (e.g., underneath (i.e., into the page)) one or more ends of one or more the arrows (e.g., arrows 410, 412, 414, 416, and/or 418) of a chain of word line drivers.

FIG. 5 is a diagram 500 illustrating an example relationship between word lines (depicted as buried word lines (BWL) (e.g., as part of an array)) and FXF driver gates. As shown in FIG. 5, buried word lines BWL0, BWL8, BWL16, and BWL24 are associated with driver gate FXFA (i.e., BWL0, BWL8, BWL16, and BWL24 are aligned with driver gate FXFA across the page in FIG. 5). Thus, in this example, buried word lines BWL0, BWL8, BWL16, and BWL24 are part of a world line driver chain, and each of buried word lines BWL0, BWL8, BWL16, and BWL24 may be coupled together and to a common source voltage in response to a HIGH signal conveyed via driver gate FXFA. Further, buried word lines BWL1, BWL9, BWL17, and BWL25 are associated with driver gate FXFB (i.e., BWL1, BWL9, BWL17, and BWL25 are aligned with driver gate FXFB across the page in the X direction). Thus, in this example, buried word lines BWL1, BWL9, BWL17, and BWL25 are part of a world line driver chain, and each of buried word lines BWL1, BWL9, BWL17, and BWL25 may be coupled together and to a common source voltage in response to a HIGH signal conveyed via driver gate FXFB.

Furthermore, buried word lines BWL2, BWL6, BWL10, BWL14, BWL18, BWL22, and BWL26 are associated with driver gate FXFC (i.e., BWL2, BWL6, BWL10, BWL14, BWL18, BWL22, and BWL26 are aligned with driver gate FXFC across the page in the X direction). Thus, in this example, buried word lines BWL2, BWL6, BWL10, BWL14, BWL18, BWL22, and BWL26 are part of a world line driver chain, and each of buried word lines BWL2, BWL6, BWL10, BWL14, BWL18, BWL22, and BWL26 may be coupled together and to a common source voltage in response to a HIGH signal conveyed via driver gate FXFC. Moreover, buried word lines BWL3, BWL7, BWL11, BWL15, BWL19, BWL23, and BWL27 are associated with driver gate FXFD (i.e., BWL3, BWL7, BWL11, BWL15, BWL19, BWL23, and BWL27 are aligned with driver gate FXFD across the page in the X direction). Thus, in this example, buried word lines BWL3, BWL7, BWL11, BWL15, BWL19, BWL23, and BWL27 are part of a world line driver chain, and each of buried word lines BWL3, BWL7, BWL11, BWL15, BWL19, BWL23, and BWL27 may be coupled together and to a common source voltage in response to a HIGH signal conveyed via driver gate FXFD.

In addition, buried word lines BWL4, BWL12, and BWL20 are associated with driver signal FXFE BWL4, BWL12, and BWL20 are aligned with driver signal FXFE across the page in the X direction). Thus, in this example, buried word lines BWL4, BWL12, and BWL20 are part of a world line driver chain, and each of buried word lines BWL4, BWL12, and BWL20 may be coupled together and to a common source voltage in response to a HIGH signal conveyed via driver gate FXFE.

Diagram 500 further depicts signal combinations for each word line (i.e., according to alignment in the Y direction in FIG. 5). More specifically, for example, buried word line BWL0 is coupled to: main word line MWL0 via a pull-up NMOS transistor (i.e., a gate of the pull-up NMOS transistor is coupled to gate FXT0); and VNWL via a pull-down NMOS transistor (i.e., a gate of the pull-down NMOS transistor is coupled to gate FXFA). As another example, buried word line BWL9 is coupled to: main word line MWL1 via a pull-up NMOS transistor (i.e., a gate of the pull-up NMOS transistor is coupled to gate FXT1); and VNWL via a pull-down NMOS transistor (i.e., a gate of the pull-down NMOS transistor is coupled to gate FXFB). As another example, buried word line BWL19 is coupled to: main word line MWL2 via a pull-up NMOS transistor (i.e., a gate of the pull-up NMOS transistor is coupled to gate FXT3); and VNWL via a pull-down NMOS transistor (i.e., a gate of the pull-down NMOS transistor is coupled to gate FXFD). As yet another example, buried word line BWL25 is coupled to: main word line MWL3 via a pull-up NMOS transistor (i.e., a gate of the pull-up NMOS transistor is coupled to gate FXT1); and VNWL via a pull-down NMOS transistor (i.e., a gate of the pull-down NMOS transistor is coupled to gate FXFB).

In some conventional devices, for sixteen (16) interleaved word lines, sixteen (16) sub word line drivers are required including sixteen (16) PMOS pull-up transistors, sixteen (16) NMOS pull-down transistors, and eight (8) NMOS word line-to-word line keepers. In some other conventional devices, for sixteen (16) "on pitch" word lines, sixteen (16) sub word line drivers are required including sixteen (16) NMOS pull-up transistors and sixteen (16) NMOS pull-down transistors. In contrast, according to various embodiments of the disclosure, for sixteen (16) "on pitch" word lines, sixteen (16) sub word line drivers including sixteen (16) NMOS pull-up transistors and eight (8) NMOS pull-down transistors may be used.

Figure 6:
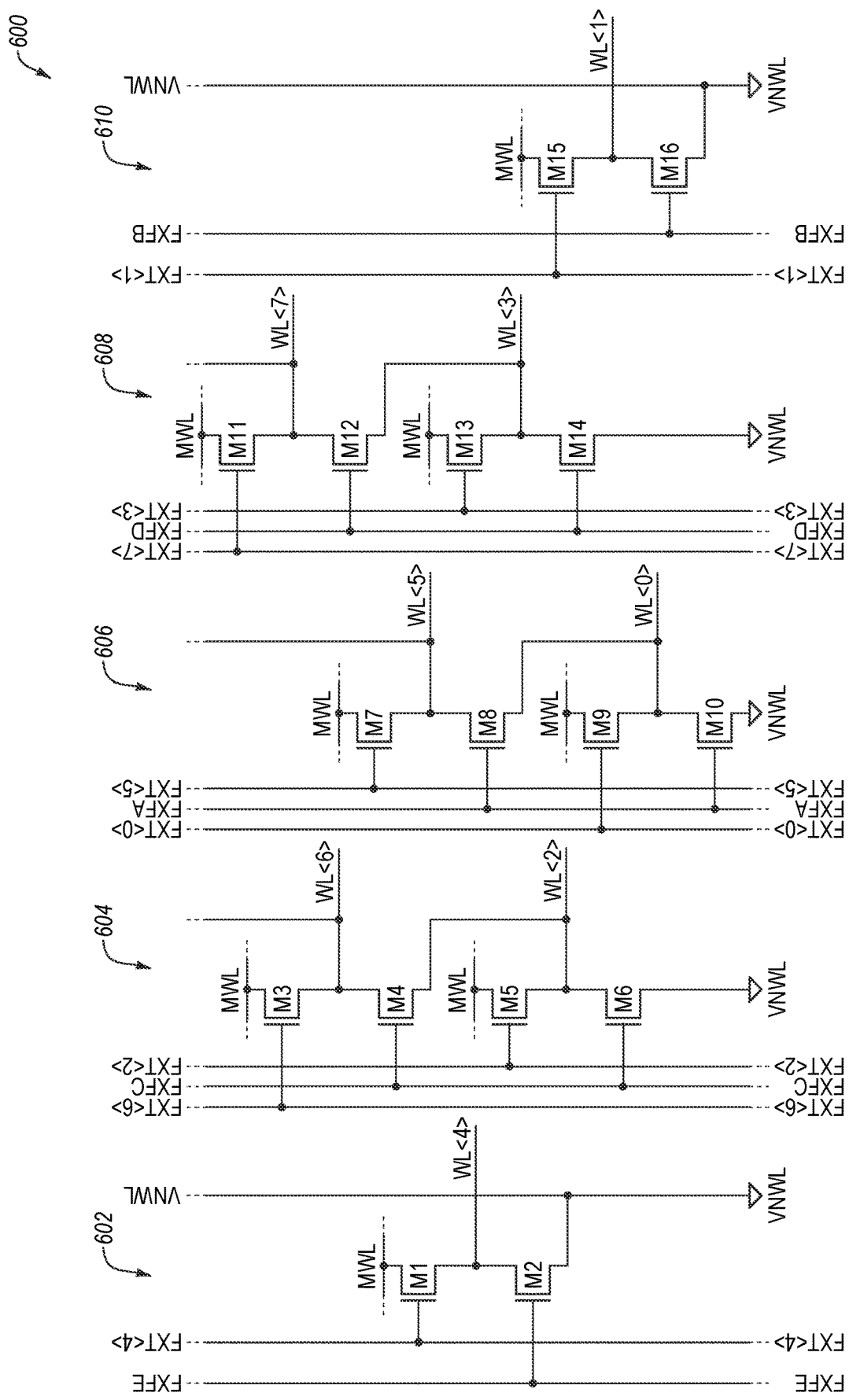
FIG. 6 depicts example word line driver circuitry, according to various embodiments of the disclosure.

FIG. 6 depicts word line driver circuitry 600, according to various embodiments of the disclosure. Word line driver circuitry 600, which may include SWD circuitry, includes a number of transistors (i.e., transistors M1-M16), wherein each transistor of the number of transistors may include, for example, an NMOS transistor. Further, FIG. 6 depicts word lines WL, main word lines MWL (e.g., MWL0, MWL1, MWL2, or MWL3 (see FIG. 5)), driver gates FXF and FXT, and negative word line voltage (VNWL).

As shown in FIG. 6, in a portion 602 of SWD circuitry 600, a first terminal (e.g., a source or drain) of transistor M1 is coupled to a main word line MWL, a gate of transistor M1 is coupled to driver gate FXT<4>, and a second terminal (e.g., a source or drain) of transistor M1 is coupled to word line WL<4>. Further, a first terminal (e.g., a source or drain) of transistor M2 is coupled to word line WL<4>, a gate of transistor M2 is coupled to driver gate FXFE, and a second terminal (e.g., a source or drain) of transistor M2 is coupled to negative word line voltage VNWL. As will be appreciated, to turn word line WL<4> ON (i.e., HIGH), driver gate FXT<4> is HIGH (e.g., at Vccp+Vt), driver gate FXFE is at LOW (e.g., at VNWL), and main word line MWL is HIGH (e.g., at Vccp). Further, to turn word line WL<4> OFF (i.e., LOW), driver gate FXT<4> is LOW (e.g., at zero volts and/or VNWL), driver gate FXFE is HIGH (e.g., at 1 volt), and main word line MWL may be at, for example, Vccp or LOW.

In another portion 604 of SWD circuitry 600, a first terminal (e.g., a source or drain) of transistor M3 is coupled to a main word line MWL, a gate of transistor M3 is coupled to driver gate FXT<6>, and a second terminal (e.g., a source or drain) of transistor M3 is coupled to word line WL<6>. Further, a first terminal (e.g., a source or drain) of transistor M4 is coupled to word line WL<6>, a gate of transistor M4 is coupled to driver gate FXFC, and a second terminal (e.g., a source or drain) of transistor M4 is coupled to word line WL<2>. Moreover, a first terminal (e.g., a source or drain) of transistor M5 is coupled to a main word line MWL, a gate of transistor M5 is coupled to driver gate FXT<2>, and a second terminal (e.g., a source or drain) of transistor M5 is coupled to word line WL<2>. Further, a first terminal (e.g., a source or drain) of transistor M6 is coupled to word line WL<2>, a gate of transistor M6 is coupled to driver gate FXFC, and a second terminal (e.g., a source or drain) of transistor M6 is coupled to negative word line voltage VNWL.

In another portion 606 of SWD circuitry 600, a first terminal (e.g., a source or drain) of transistor M7 is coupled to a main word line MWL, a gate of transistor M7 is coupled to driver gate FXT<5>, and a second terminal (e.g., a source or drain) of transistor M5 is coupled to word line WL<5>. Further, a first terminal (e.g., a source or drain) of transistor M8 is coupled to word line WL<5>, a gate of transistor M8 is coupled to driver gate FXFA, and a second terminal (e.g., a source or drain) of transistor M8 is coupled to word line WL<0>. Moreover, a first terminal (e.g., a source or drain) of transistor M9 is coupled to a main word line MWL, a gate of transistor M9 is coupled to driver gate FXT<0>, and a second terminal (e.g., a source or drain) of transistor M9 is coupled to word line WL<0>. Further, a first terminal (e.g., a source or drain) of transistor M10 is coupled to word line WL<0>, a gate of transistor M10 is coupled to driver gate FXFA, and a second terminal (e.g., a source or drain) of transistor M10 is coupled to negative word line voltage VNWL.

In another portion 608 of SWD circuitry 600, a first terminal (e.g., a source or drain) of transistor M11 is coupled to a main word line MWL, a gate of transistor M11 is coupled to driver gate FXT<7>, and a second terminal (e.g., a source or drain) of transistor M11 is coupled to word line WL<7>. Further, a first terminal (e.g., a source or drain) of transistor M12 is coupled to word line WL<7>, a gate of transistor M12 is coupled to driver gate FXFD, and a second terminal (e.g., a source or drain) of transistor M12 is coupled to word line WL<3>. Moreover, a first terminal (e.g., a source or drain) of transistor M13 is coupled to a main word line MWL, a gate of transistor M13 is coupled to driver gate FXT<3>, and a second terminal (e.g., a source or drain) of transistor M13 is coupled to word line WL<3>. Further, a first terminal (e.g., a source or drain) of transistor M14 is coupled to word line WL<3>, a gate of transistor M14 is coupled to driver gate FXFD, and a second terminal (e.g., a source or drain) of transistor M14 is coupled to negative word line voltage VNWL.

In addition, in another portion 610 of SWD circuitry 600, a first terminal (e.g., a source or drain) of transistor M15 is coupled to a main word line MWL, a gate of transistor M15 is coupled to driver gate FXT<1>, and a second terminal (e.g., a source or drain) of transistor M15 is coupled to word line WL<1>. Further, a first terminal (e.g., a source or drain) of transistor M16 is coupled to word line WL<1>, a gate of transistor M16 is coupled to driver gate FXFB, and a second terminal (e.g., a source or drain) of transistor M16 is coupled to negative word line voltage VNWL.

According to one contemplated operation, if driver gate FXT<2> is HIGH, driver gate FXFC may be LOW, and word line WL<2> may be coupled to its associated main word line MWL. Further, if driver gates FXT<2> and FXT<6> are LOW, driver gate FXFC may be HIGH, and word line WL<2> and word line <6> may be coupled together and to negative word line voltage VNWL. Similarly, as another example, if driver gate FXT<7> is HIGH, driver gate FXFD may be LOW, and word line WL<7> may be coupled to its associated main word line MWL. Further, if driver gates FXT<7> and FXT<3> are LOW, driver gate FXFD may be HIGH, and word line WL<7> and word line <3> may be coupled together and to negative word line voltage VNWL.

Figure 7A:
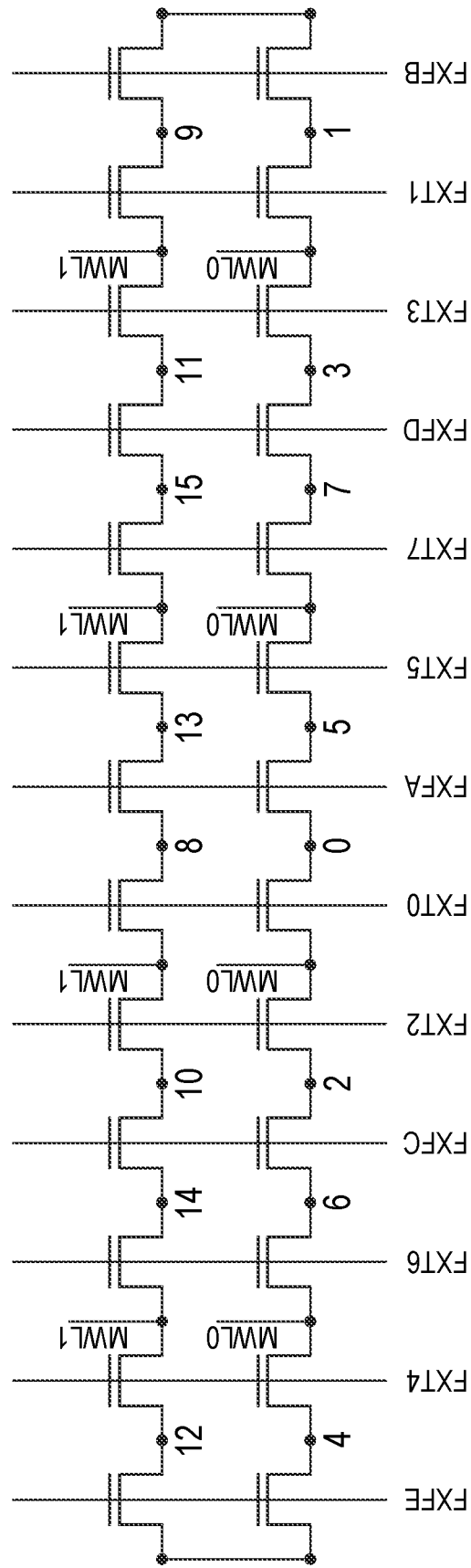
FIG. 7A illustrates a circuit, according to various embodiments of the disclosure.

FIG. 7A illustrates a circuit 700, according to various embodiments of the disclosure. Circuit 700 includes a number of transistors, a number of word lines 0-15, driver gates FXT and FXF, and main word lines MWL0 and MWL1. Similar to the embodiment shown in FIG. 4, word line driver circuitry (i.e., pull-down transistors) associated with each of word lines 4 and 12 share an FXF gate (i.e., driver gate FXFE in this example). Further, word line driver circuitry (i.e., pull-down transistors) associated with each of word lines 2, 6, 10, and 14 share an FXF gate (i.e., driver gate FXFC in this example). Furthermore, word line driver circuitry (i.e., pull-down transistors) associated with each of word lines 0, 5, 8, and 13 share an FXF gate (i.e., driver gate FXFA in this example). Moreover, word line driver circuitry (i.e., pull-down transistors) associated with each of word lines 3, 7, 11, and 15 share an FXF gate (i.e., driver gate FXFD in this example). In addition, word line driver circuitry (i.e., pull-down transistors) associated with each of word lines 1 and 19 share an FXF gate (i.e., driver gate FXFB in this example).

Figure 7B:
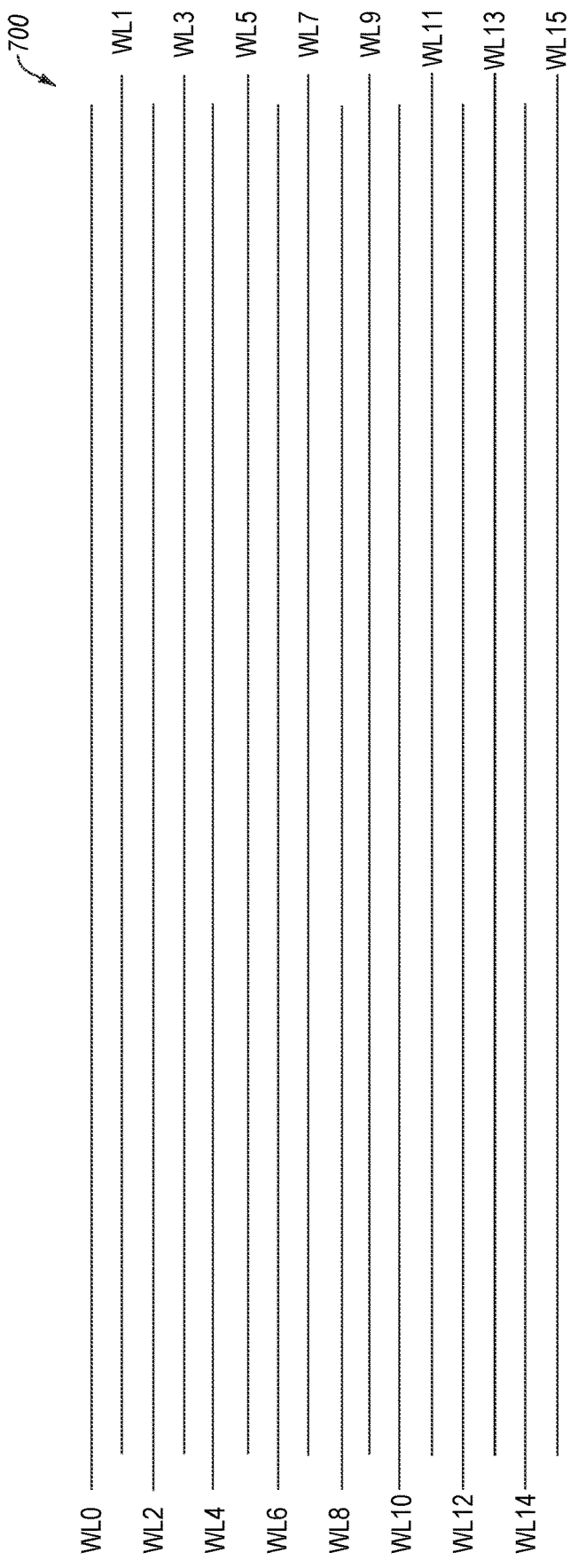
FIG. 7B depicts a word line driver gap including even-numbered word lines and odd-numbered word lines, in accordance with various embodiments of the disclosure.
Figure 7C:
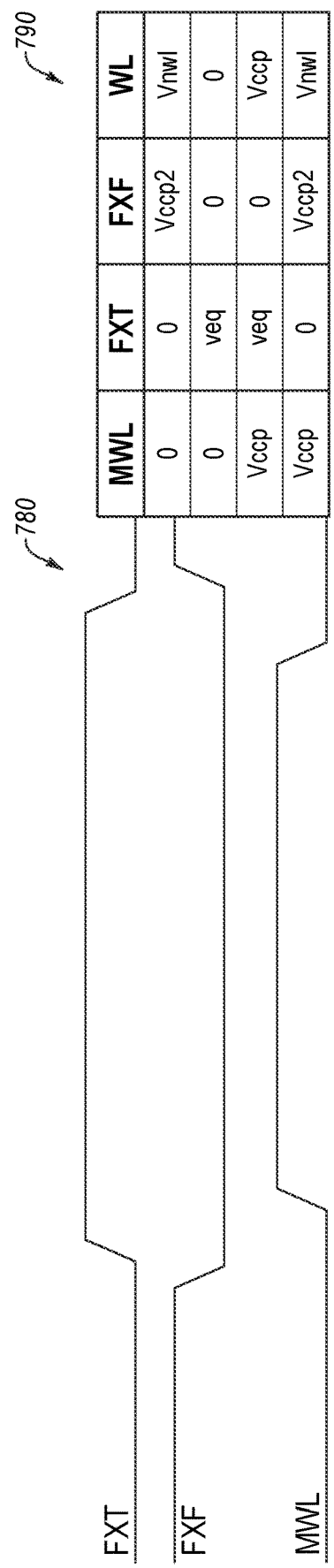
FIG. 7C depicts a plot including a number of signals associated with a word line driver, in accordance with various embodiments of the disclosure.

FIG. 7B illustrates a word line driver (e.g., sub word line driver) gap 700 including both even-numbered word lines (WL0-WL14) and odd-numbered word lines (WL1-WL15), in accordance with various embodiments. Further, FIG. 7C depicts a plot 780 of a number of signals associated with a word line driver, in accordance with various embodiments of the disclosure. Specifically, plot 780 depicts driver gate FXT, driver gate FXF, and main word line signal MWL. FIG. 7C further depicts a table 790 showing voltage states of driver gate FXT, driver gate FXF, main word line signal MWL, and a word line WL.

As shown in plot 780 and table 790, to turn a word line ON, an associated driver gate FXT (i.e., coupled to a gate of an associated pull-up transistor) may transition from LOW (e.g., 0 volt) to HIGH (e.g., voltage Vccp2 (e.g., 4.2 volts)), an associated driver gate FXF (i.e., coupled to a gate of an associated pull-down transistor) may transition from HIGH (e.g., a mid-voltage VEQ (e.g., 1 volt)) to LOW (e.g., 0 volt), and an associated main word line signal MWL may transition from LOW (e.g., 0 volt) to HIGH (e.g., voltage VCCP (e.g., 3.2 volts)). To turn the word line OFF, an associated driver gate FXT (i.e., coupled to a gate of an associated pull-up transistor) may transition from HIGH (e.g., voltage Vccp2 (e.g., 4.2 volts)) to LOW (e.g., 0 volt), an associated driver gate FXF (i.e., coupled to a gate of an associated pull-down transistor) may transition from LOW (e.g., 0 volt) to HIGH (e.g., a mid-voltage VEQ (e.g., 1 volt)), and an associated main word line signal MWL may transition from HIGH (e.g., voltage VCCP (e.g., 3.2 volts)) to LOW (e.g., 0 volt).

Further, in one non-limiting example shown in table 790, if, for an associated word line driver, main word line signal MWL and driver signal FXT are LOW (e.g., at 0 volts) and driver gate FXF is HIGH (e.g., at 1 volt), an associated word line WL may be at negative word line voltage VNWL (e.g., 0.2 volts). In addition, if, for an associated word line driver, main word line signal MWL and driver gate FXF are LOW (e.g., at 0 volts) and driver gate FXT is HIGH (e.g., at 4.2 volts), an associated word line WL may be LOW (e.g., at 0 volts). Moreover, if, for an associated word line driver, main word line signal MWL is at 3.2 volts, driver gate FXT is at 4.2 volts, and driver gate FXF is at 0 volt, an associated word line WL may be at 3.2 volts. In addition, if, for an associated word line driver, main word line signal MWL is at 3.2 volts, driver gate FXT is at 0 volt, and driver gate FXF is at 1 volt, an associated word line WL may be at 0.2 volts.

FIG. 8A depicts a conventional interleaved SWD array 802 including a number of cores, wherein each gap 803 of the cores includes either an even SWD driver 810 or an odd SWD driver 812. FIG. 8B depicts an on pitch word line driver array (e.g., SWD) array 804 including a number of cores, according to various embodiments of the disclosure. In on pitch array 804, each gap 805 of the cores includes an even driver 810 and an odd driver 812. Thus, compared to interleaved SWD array 802, in the embodiment shown in FIG. 8B, even and odd word lines may be driven from a single gap 805, and thus a number of memory bits driven via a single gap may be increased.

Figure 9:
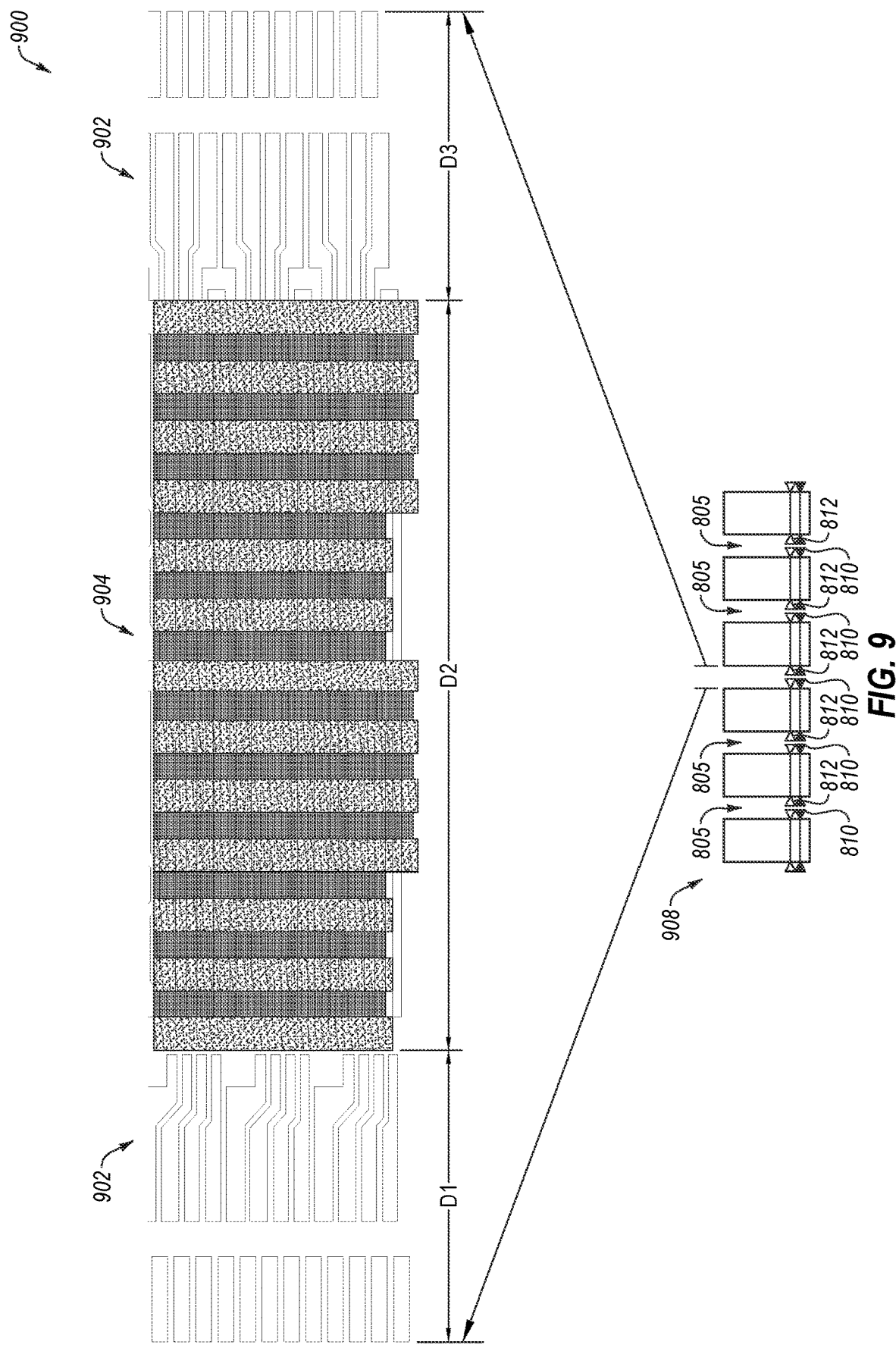
FIG. 9 illustrates a portion of a memory device including word line driver circuitry, according to various embodiments of the disclosure.

FIG. 9 illustrates a portion 900 of a memory device including interface areas 902 and sub word line driver circuitry 904, according to various embodiments of the disclosure. As depicted in FIG. 9, a gap 805 of a core 908 may include portion 900 of the memory device, wherein sub word line driver circuitry 904 is configured such that even and odd word lines may be driven from a single gap 805. According to various embodiments, a dimension D1 (e.g., a width) may be substantially 0.808 micrometers, a dimension D2 (e.g., a width) may be substantially 2.3 micrometers, and a dimension D3 (e.g., a width) may be substantially 0.808 micrometers. In contrast, dimension D2 (i.e., between BWL interfaces) of some conventional memory devices (i.e., including a sixteen (16) gate NMOS SWD) may be substantially 3.01 micrometers.

Figure 10A:
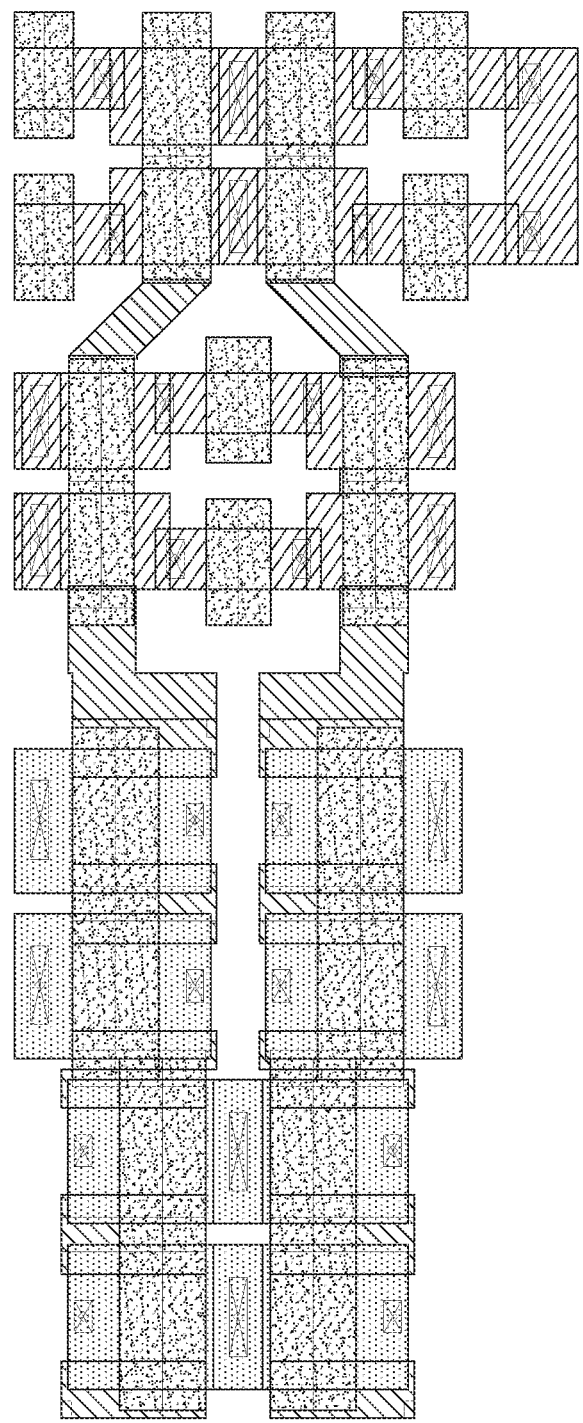
FIG. 10A depicts a word line driver layout of a conventional memory device.
Figure 10B:
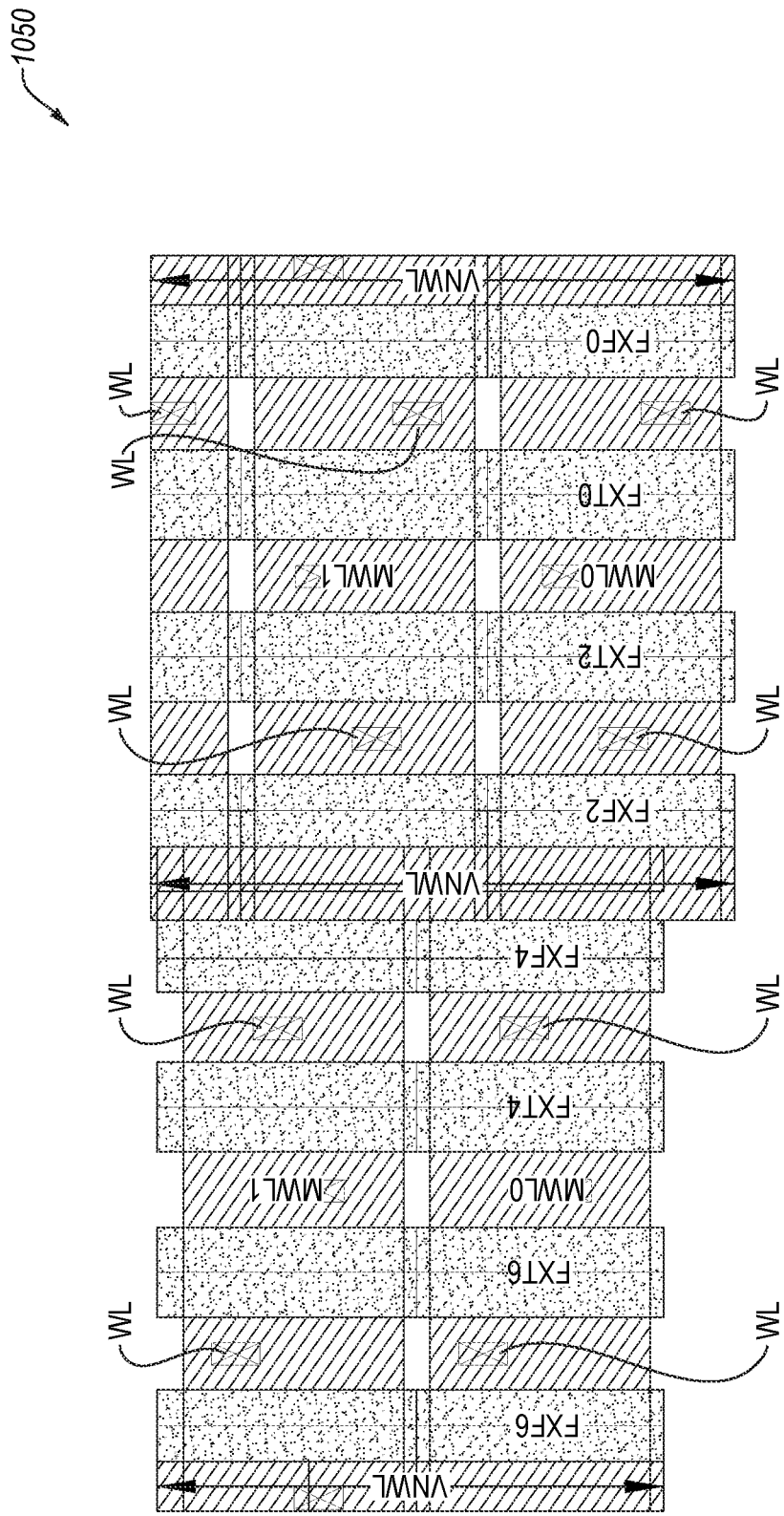
FIG. 10B depicts an example layout of a word line driver, in accordance with various embodiments of the disclosure.

FIG. 10A depicts a SWD layout 1000 of a conventional memory device. Layout 1000 includes driver gates (e.g., poly gates) in a horizontal configuration. In contrast, an SWD layout 1050 depicted in FIG. 10B, which may be an NMOS SWD, may include an active area that is rotated relative to an active area of SWD layout 1000, and thus driver gates (e.g., poly gates) (i.e., driver gates FXF0, FXT0, FXF2, FXT2, FXF4, FXT4, FXF6, and FXT6) of layout 1050 are in a vertical configuration. Layout 1050 further includes a voltage source (e.g., negative word line voltage VNWL), word lines WL, and main word lines MWL (i.e., main word lines MWL0 and main word lines MWL1). As will be appreciated, SWD layout 1050 is an even-odd configuration (i.e., even word lines are positioned in one SWD gap and odd word lines are positioned in another, different SWD gap) (e.g., for driving 1k word lines).

As will be appreciated, a size of an NMOS SWD may be reduced relative to a SWD including PMOS devices. Further, as described above regarding at least FIGS. 4-9, utilizing shared driver gates may further reduce a size of an SWD.

As will be appreciated, due to current pitch cell process, an area of supporting circuitry of memory devices does not shrink at a rate equal to a rate at which an array area shrinks. In other words, asymmetric scaling of memory device array areas and supporting circuitry occurs, which negatively affects an array efficiency (i.e., a metric commonly used to evaluate at least some memory devices (e.g., DRAM devices)).

Figure 11:
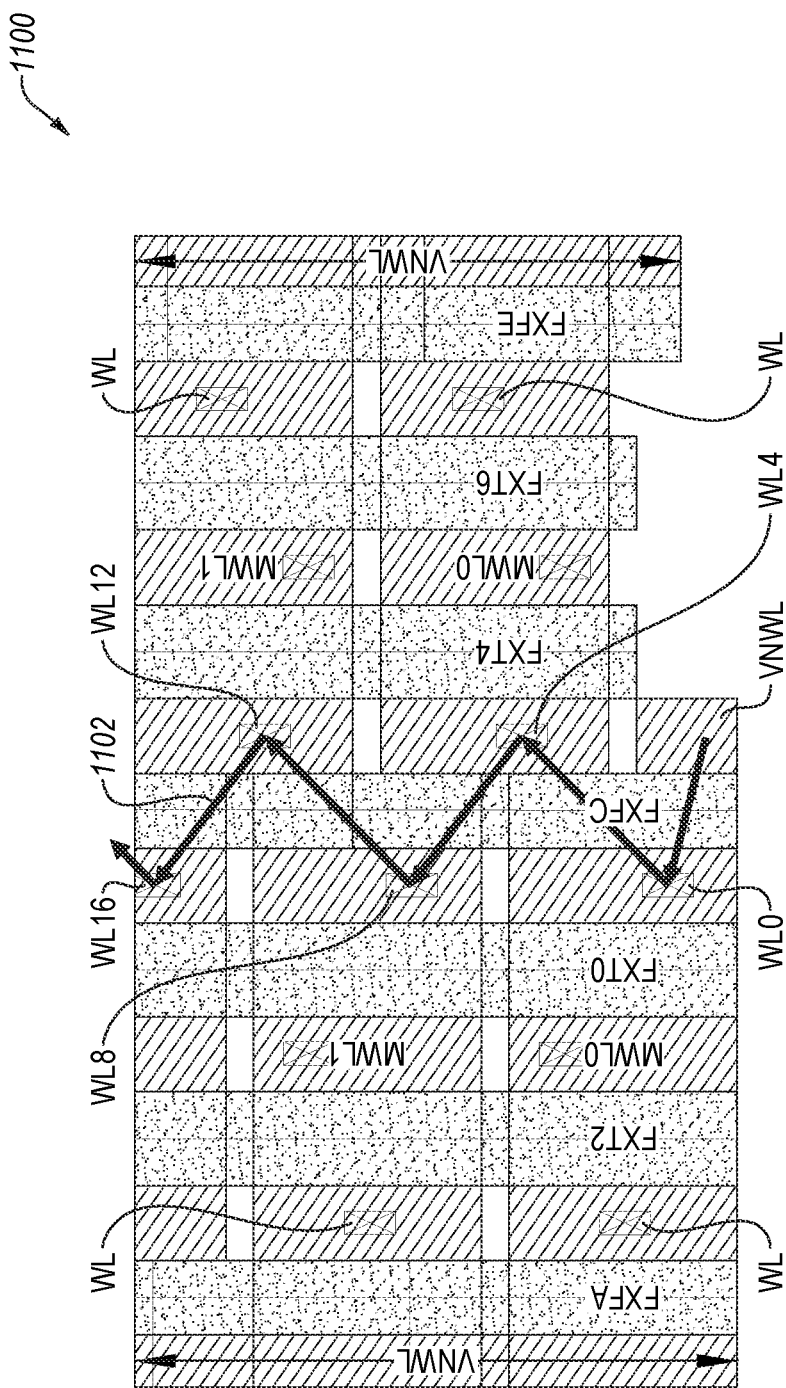
FIG. 11 depicts another example layout of a word line driver, according to various embodiment of the disclosure.

According to various embodiments of the disclosure, a size of an SWD may be reduced (e.g., in comparison to SWD layout 1050 of FIG. 10B) by removing a driver gate and a negative word line voltage VNWL active area node. FIG. 11 depicts an example layout 1100 of word line driver circuitry (e.g., SWD circuitry) including a number of word lines, according to various embodiments of the disclosure. Layout 1100, which may be part of a memory device (e.g., memory device 100 of FIG. 1), includes driver gates FXF and FXT (e.g., poly gates). More specifically, layout 1100 includes driver gates FXT0, FXT2, FXT4, FXT6, FXFA, FXFC, and FXFE. Layout 1100 further includes a voltage source (e.g., negative word line voltage VNWL), word lines WL, and main word lines MWL (i.e., main word lines MWL0 and main word lines MWL1). As will be appreciated, SWD layout 1100 is an even-odd configuration (i.e., even word lines are positioned in one SWD gap and odd word lines are positioned in another, different SWD gap). In other words, a layout according to the embodiment illustrated in FIG. 11 may be configured to drive even word lines and odd word lines in separate SWD gaps (e.g., for driving 1k word lines), wherein layout 400 of FIG. 4 may drive both even and odd word lines in a single SWD gap (e.g., for driving 2k word lines).

In the embodiments shown in FIG. 11, a single FXF driver gate (i.e., driver gate FXFC) is at least partially positioned between two FXT driver gates and is shared by word lines of an interior phase. More specifically, in contrast to layout 1050 of FIG. 10B, wherein each phase includes a dedicated phase bar (i.e., driver gate FXT0 is associated with dedicated driver gate FXF0, driver gate FXT2 is associated with dedicated driver gate FXF2, driver gate FXT4 is associated with dedicated driver gate FXF4, and driver gate FXT6 is associated with dedicated driver gate FXF6), driver gate FXFC is at least partially positioned between driver gates FXT0 and FXT4 and driver gate FXFC is shared by word lines associated with driver gates FXT0 and FXT4. Further, in these embodiments, the active areas proximate driver gate FXFC (e.g., one on each side (e.g., to the left and right) of driver gate FXFC) are staggered such that, for example, the word lines coupled to the interior phases may be linked in a chain (e.g., serpentine chain) 1102 in response to a driver signal conveyed via driver gate FXFC. According to some embodiments, in response to a driver signal conveyed via driver gate FXFC, each word line in chain 1102 may be coupled to common voltage source (e.g., a negative word line voltage VNWL). More specifically, for example, in response to a driver signal conveyed via driver gate FXFC, each word line in chain 1102 (i.e., word line WL0, word line WL4, word line WL8, word line WL12, word line WL16, and so on.) may be coupled to a negative word line voltage VNWL node at a first end (e.g., at a top) of an SWD gap and negative word line voltage VNWL node at a second end (e.g., at a bottom) of the SWD gap. In comparison to layout 1050 of FIG. 10B, which includes eight (8) driver gates, layout 1100 includes seven (7) driver gates.

Figure 12:
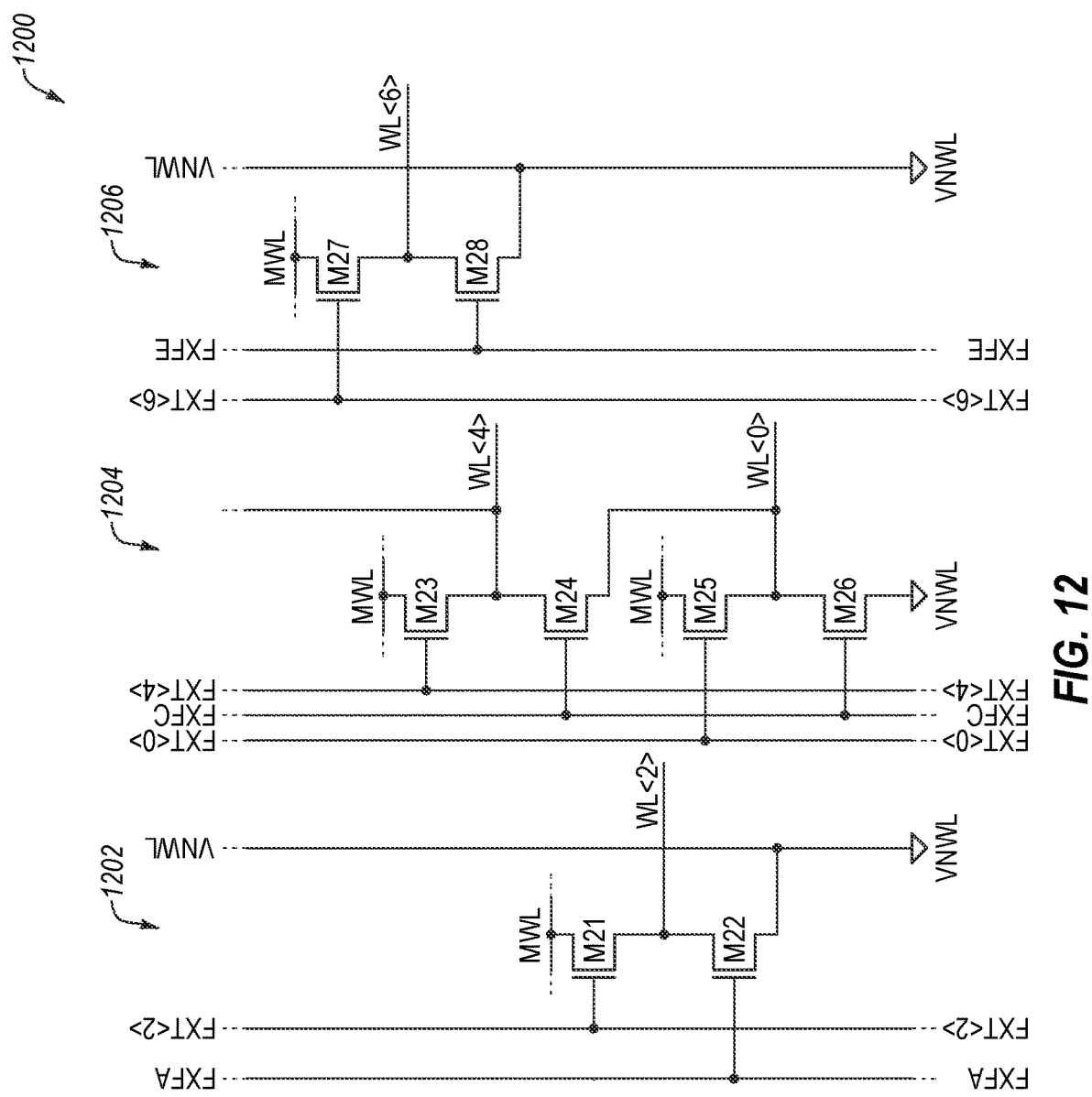
FIG. 12 depicts example word line driver circuitry, according to various embodiments of the disclosure.

FIG. 12 depicts word line driver circuitry 1200, according to various embodiments of the disclosure. Word line driver circuitry 1200, which may include SWD circuitry, includes a number of transistors (i.e., transistors M21-M28), wherein each transistor of the number of transistors may include, for example, an NMOS transistor. Further, FIG. 12 depicts word lines WL, main word lines MWL (e.g., MWL0 or MWL1 of FIG. 11), driver gates FXF and FXT, and a voltage source (e.g., negative word line voltage VNWL). For example, word line driver circuitry 1200 may be a circuit representation of layout 1100 of FIG. 11.

As shown in FIG. 12, in a portion 1202 of SWD circuitry 1200, a first terminal (e.g., a source or drain) of transistor M21 is coupled to a main word line MWL, a gate of transistor M21 is coupled to driver gate FXT<2>, and a second terminal (e.g., a source or drain) of transistor M21 is coupled to word line WL<2>. Further, a first terminal (e.g., a source or drain) of transistor M22 is coupled to word line WL<2>, a gate of transistor M22 is coupled to driver gate FXFA, and a second terminal (e.g., a source or drain) of transistor M22 is coupled to negative word line voltage VNWL. As will be appreciated, to turn word line WL<2>

ON (i.e., HIGH), driver gate FXT<2> is HIGH (e.g., at Vccp+Vt), driver gate FXFA is at LOW (e.g., at or lower than VNWL), and main word line MWL is HIGH (e.g., at Vccp). Further, to turn word line WL<2> OFF (i.e., LOW), driver gate FXT<2> is LOW (e.g., at zero volts and/or at or lower than VNWL), driver gate FXFA is HIGH (e.g., around 2 volts), and main word line MWL may be at, for example, Vccp or LOW.

In another portion 1204 of SWD circuitry 1200, a first terminal (e.g., a source or drain) of transistor M23 is coupled to a main word line MWL, a gate of transistor M23 is coupled to driver gate FXT<4>, and a second terminal (e.g., a source or drain) of transistor M23 is coupled to word line WL<4>. Further, a first terminal (e.g., a source or drain) of transistor M24 is coupled to word line WL<4>, a gate of transistor M24 is coupled to driver gate FXFC, and a second terminal (e.g., a source or drain) of transistor M24 is coupled to word line WL<0>. Moreover, a first terminal (e.g., a source or drain) of transistor M25 is coupled to a main word line MWL, a gate of transistor M25 is coupled to driver gate FXT<0>, and a second terminal (e.g., a source or drain) of transistor M25 is coupled to word line WL<0>. Further, a first terminal (e.g., a source or drain) of transistor M26 is coupled to word line WL<0>, a gate of transistor M26 is coupled to driver gate FXFC, and a second terminal (e.g., a source or drain) of transistor M26 is coupled to negative word line voltage VNWL.

In another portion 1206 of SWD circuitry 1200, a first terminal (e.g., a source or drain) of transistor M27 is coupled to a main word line MWL, a gate of transistor M27 is coupled to driver gate FXT<6>, and a second terminal (e.g., a source or drain) of transistor M25 is coupled to word line WL<6>. Further, a first terminal (e.g., a source or drain) of transistor M28 is coupled to word line WL<6>, a gate of transistor M28 is coupled to driver gate FXFE, and a second terminal (e.g., a source or drain) of transistor M28 is coupled to negative word line voltage VNWL.

With reference to FIG. 11 and/or FIG. 12, according to various embodiments, if driver gate FXFC is ON (i.e., when no word lines in chain 1102 are activated), the word lines coupled in chain 1102 may be coupled to negative word line voltage VNWL at, for example, a top and a bottom of an associated SWD gap. Word lines near the center of the SWD gap may be considered a worst-case scenario (i.e., because the word lines near the center of the SWD gap are positioned farthest from the VNWL nodes). However, all word lines coupled in chain 1102 may benefit from an RC load (e.g., a relatively large RC load), which may dampen undesired coupling (e.g., even for the worst-case scenario).

In at least some embodiments, if driver gate FXFC is OFF (i.e., when a word line in chain 1102 is activated), other word lines coupled in chain 1102 may float. Based on how the word lines are coupled, floating word lines may be shielded by a number of (e.g., three (3)) word lines linked to a strong negative word line voltage VWNL node.

Further, according to some embodiments, driver gate FXFC may be toggled when either of the two interior phases (i.e., driver gate FXT4 and driver gate FXT0) are active. In at least these embodiments, the number of FXF signals may be reduced (e.g., by one (1) signal) and the number or FXF drivers within an associated row decoder may be reduced (e.g., by one (1) driver).

Figure 13:
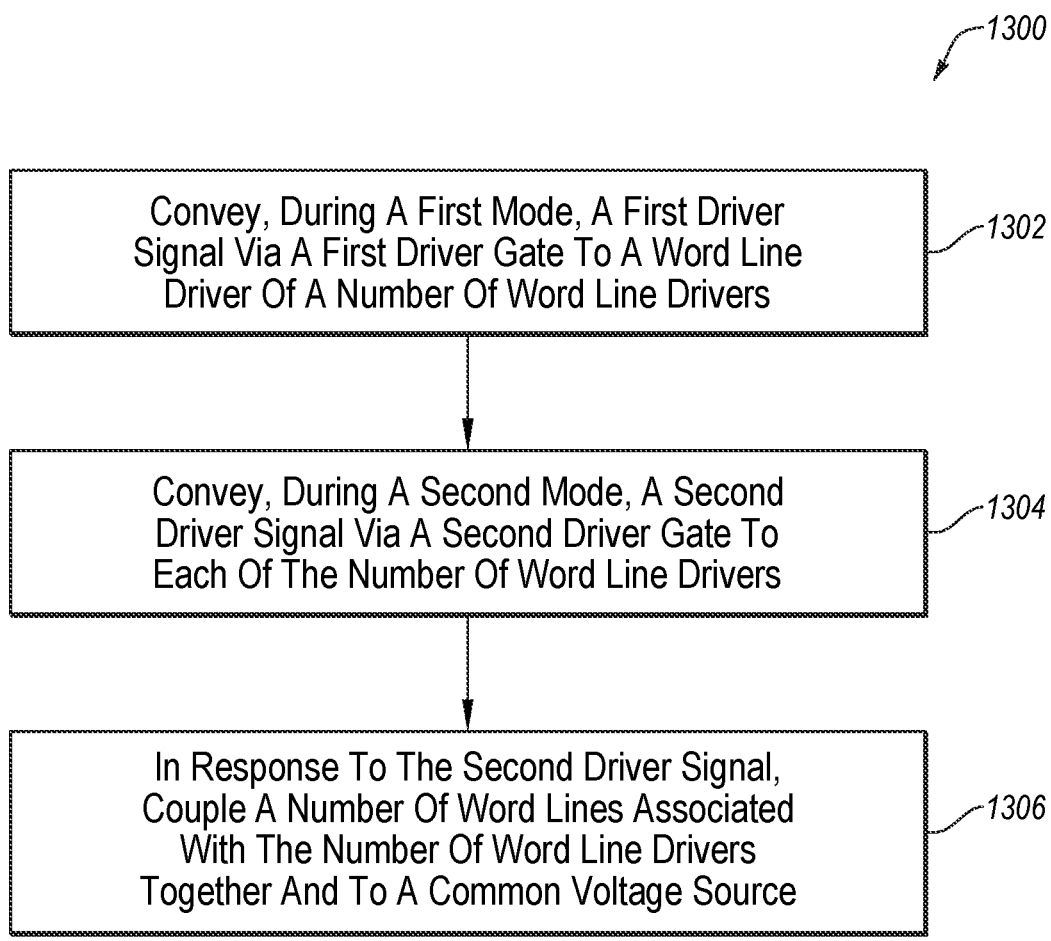
FIG. 13 is a flowchart of an example method of operating a memory device, in accordance with various embodiments of the present disclosure.

FIG. 13 is a flowchart of an example method 1300 of operating a memory device, in accordance with various embodiments of the disclosure. Method 1300 may be arranged in accordance with at least one embodiment described in the present disclosure. Method 1300 may be performed, in some embodiments, by a circuit, a device, or a system, such as memory device 100 of FIG. 1, memory device 200 of FIG. 2, sub word line driver circuitry layout 400 of FIG. 4, sub word line driver circuitry 600 of FIG. 6, circuitry 700 of FIG. 7A, sub word line driver array 804 of FIG. 8B, portion 900 of the memory device of FIG. 9, layout 1100 of FIG. 11, word line driver circuitry 1200 of FIG. 12, memory device 1400 of FIG. 14, and/or electronic system 1500 of FIG. 15, or another device or system. Although illustrated as discrete blocks, various blocks may be divided into additional blocks, combined into fewer blocks, or eliminated, depending on the desired implementation.

Method 1300 may begin at block 1302, wherein, during a first mode, a first driver signal may be conveyed via a first driver gate to a word line driver of a number of word line drivers, and method 1300 may proceed to block 1304. For example, during an active mode, a HIGH signal may be conveyed via an FXT driver gate to a gate of a pull-up transistor of the word line driver (i.e., to couple an associated word line to a main word line).

At block 1304, during a second mode, a second driver signal may be conveyed via a second driver gate to each of the number of word line drivers, and method 1300 may proceed to block 1306. For example, during an inactive mode, a HIGH driver signal may be conveyed via an FXF driver gate (e.g., FXFA, FXFB, FXFC, FXFD, or FXFE of FIG. 4, FIG. 5, FIG. 6, FIG. 11, and/or FIG. 12) to a gate of a pull-down transistor of each of the number of word line drivers.

At block 1306, in response to the second driver signal, a number of word lines associated with the number of word line drivers may be coupled together and to a common voltage source. For example, with reference to FIG. 4, in response to a HIGH signal conveyed via driver gate FXF, word lines WL0, WL5, WL8, WL13, WL16, WL21, and WL24 may be coupled together and to negative word line voltage VNWL. As another example, with reference to FIG. 11, in response to a HIGH signal conveyed via driver gate FXFC, word lines WL0, WL4, WL8, WL12, and WL16 may be coupled together and to negative word line voltage VNWL.

Modifications, additions, or omissions may be made to method 1300 without departing from the scope of the present disclosure. For example, the operations of method 1300 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

A memory device is also disclosed. According to various embodiments, the memory device may include one or more memory cell arrays, such as memory cell array 102 (see FIG. 1). The one or more memory cell arrays may include a number of memory cells.

Figure 14:
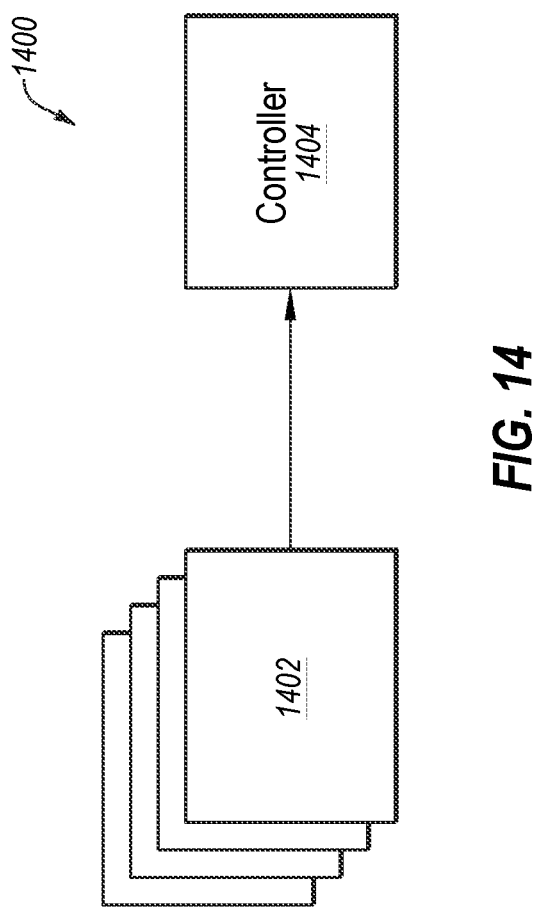
FIG. 14 is a simplified block diagram of a memory device, in accordance with various embodiments of the present disclosure.

FIG. 14 is a simplified block diagram of a memory device 1400 implemented according to one or more embodiments described herein. Memory device 1400, which may include, for example, a semiconductor device, includes a memory array 1402 and a controller 1404. Memory array 1402, which may include a number of memory banks, may include a number of memory cells.

Controller 1404 may be operatively coupled with memory array 1402 so as to read, write, or refresh any or all memory cells within memory array 1402. Controller 1404 may be configured for carrying out one or more embodiments disclosed herein. For example, in some embodiments, controller 1404 may include at least a portion of, for example, driver control circuitry 210 of FIG. 2, word line driver 208 of FIG. 2, word line driver circuitry layout 400 of FIG. 4, word line driver circuitry 600 of FIG. 6, circuitry 700 of FIG. 7A, word line driver array 804 of FIG. 8B, layout 1100 of FIG. 11, and/or word line driver circuitry 1200 of FIG. 12.

A system is also disclosed. According to various embodiments, the system may include a memory device including a number of memory banks, each memory bank having an array of memory cells. Each memory cell may include an access transistor and a storage element operably coupled with the access transistor.

Figure 15:
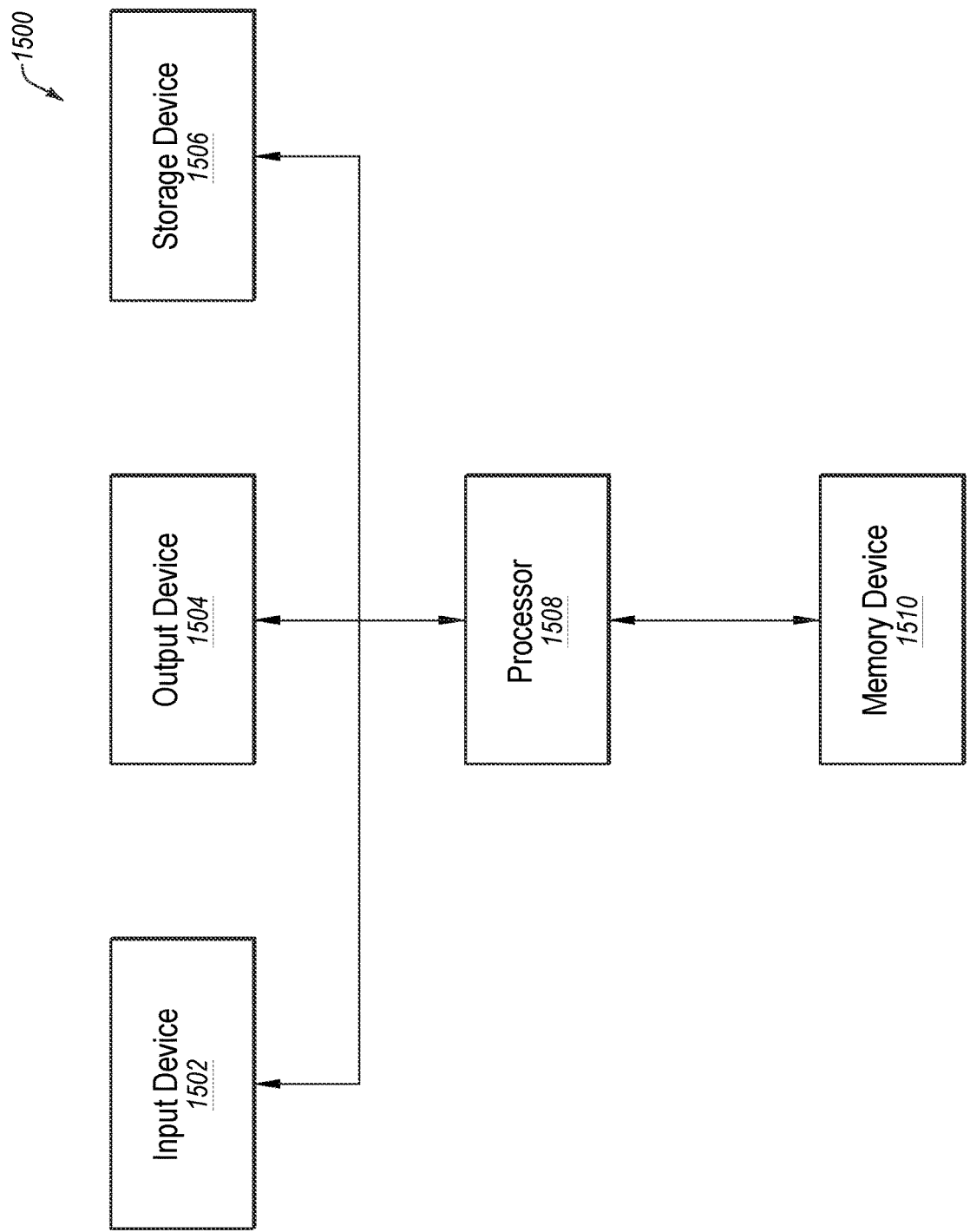
FIG. 15 is a simplified block diagram of an electronic system, in accordance with various embodiments of the present disclosure.

FIG. 15 is a simplified block diagram of an electronic system 1500 implemented according to one or more embodiments described herein. Electronic system 1500 includes at least one input device 1502, which may include, for example, a keyboard, a mouse, or a touch screen. Electronic system 1500 further includes at least one output device 1504, such as a monitor, a touch screen, or a speaker. Input device 1502 and output device 1504 are not necessarily separable from one another. Electronic system 1500 further includes a storage device 1506. Input device 1502, output device 1504, and storage device 1506 may be coupled to a processor 1508. Electronic system 1500 further includes a memory device 1510 coupled to processor 1508. Memory device 1510, which may include memory device 1400 of FIG. 14, may include an array of memory cells. Electronic system 1500 may include, for example, a computing, processing, industrial, or consumer product. For example, without limitation, electronic system 1500 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the disclosure may include a device including a number of word line drivers, wherein each word line driver of the number of word line drivers includes a first transistor and a second transistor. The device may also include a number of first driver gates, wherein the first transistor of each word line driver includes a gate coupled to a dedicated first driver gate of the number of driver gates. Further, the device may include a second driver gate coupled to a gate of each second transistor of each of the number of word line drivers.

According to other embodiments of the disclosure, a device may include a number of word lines and a chain of word line drivers. Each word line driver of the chain of word line drivers may be coupled to an associated word line of the number of word lines. Each word line driver of the chain of word line drivers may be configured to couple the associated word line to an associated main word line via a first transistor. Further, each word line driver of the chain of word line drivers may be configured to couple the associated word line to at least one other word line of the number of word lines and a common negative word line voltage source via a second transistor.

One or more other embodiments of the present disclosure include a method of operating a memory device. The method may include conveying, during a first mode, a first driver signal via a first driver gate to a word line driver of a number of word line drivers. The method may further include conveying, during a second mode, a second driver signal via a second driver gate to each of the number of word line drivers. Moreover, the method may include, in response to the second driver signal, coupling a number of word lines associated with the number of word line drivers together and to a common voltage source.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and including sub word line driver circuitry. The sub word line driver circuitry may include a number of sub word line drivers. Each sub word line driver may include a pull-up transistor for coupling an associated word line to a main word line and a pull-down transistor for coupling the associated word line to a negative word line voltage. The sub word line driver circuitry may further include a number of first driver gates, wherein each sub word line driver is coupled to a dedicated first driver gate of the number of driver gates. Moreover, the sub word line driver circuitry may include a number of second driver gates, wherein more than one sub word line driver of the number of sub word line drivers is coupled to a second driver gate of the number of second driver gates.

According to other embodiments, a device may include a first word line driver configured to drive a first word line and a second word line driver configured to drive a second word line. The device may also include a first driver gate coupled to the first word line driver and configured to convey a first driver signal to couple the first word line to a first main word line. The device may further include a second driver gate coupled to the second word line driver and configured to convey a second driver signal to couple the second word line to a second main word line. Further, the device may include a third driver gate coupled to each of the first word line driver and the second word line driver and configured to convey a third driver signal to couple each of the first word line and the second word line to a common voltage source.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   two or more word line drivers, each word line driver of the two or more word line drivers including a first transistor and a second transistor;
   a number of first driver gates, the first transistor of each word line driver having a source or drain coupled to an associated main word line and a gate coupled to a dedicated driver gate of the number of first driver gates such that each first driver gate is coupled to a gate of a single, dedicated transistor and such that the first transistor of a first word line driver of the two or more word line drivers is coupled to one driver gate of the number of first driver gates and the first transistor of a second word line driver of the two or more word line drivers is coupled to another, different driver gate of the number of first driver gates; and
   a second driver gate coupled to a gate of each second transistor of each of the two or more word line drivers such that the second driver gate is shared by each of the two or more word line drivers.

2. The device of claim 1, wherein each word line driver is configured to, in response to receipt of a signal via the dedicated first driver gate, couple an associated word line to the associated main word line.

3. The device of claim 1, wherein the two or more word line drivers are configured such that, in response to receipt of a signal via the second driver gate, a number of word lines associated with the two or more word line drivers couple together.

4. The device of claim 1, wherein the second transistor of each of the two or more word line drivers is configured to, in response to receipt of a signal via the second driver gate, couple an associated word line to a common negative word line voltage.

5. The device of claim 1, wherein the two or more word line drivers are configured such that, in response to receipt of a signal via the second driver gate, a number of word lines associated with the two or more word line drivers couple together and to a common voltage source.

6. The device of claim 1, wherein for each word line driver:
   a first terminal of the first transistor is coupled to the associated main word line;
   a second terminal of the first transistor is coupled to an associated word line;
   a first terminal of the second transistor is coupled to the associated word line; and
   a second terminal of the second transistor is coupled to a word line associated with another word line driver or a negative word line voltage source.

7. A system, comprising:
   at least one input device;
   at least one output device;
   at least one processor device operably coupled to the input device and the output device; and
   at least one memory device operably coupled to the at least one processor device and including sub word line driver circuitry comprising:
      two or more sub word line drivers, wherein each sub word line driver includes:
         a pull-up transistor having a source or drain coupled to a main word line and for coupling an associated word line to the main word line; and
         a pull-down transistor for coupling the associated word line to a negative word line voltage;
      a number of first driver gates, wherein each sub word line driver is coupled to a dedicated first driver gate of the number of first driver gates such that each first driver gate is coupled to a gate of a single, dedicated transistor and such that the pull-up transistor of a first sub word line driver of the two or more sub word line drivers is coupled to one driver gate of the number of first driver gates and the pull-up transistor of a second sub word line driver of the two or more sub word line drivers is coupled to another, different driver gate of the number of first driver gates; and a number of second driver gates, wherein more than one sub word line driver of the two or more sub word line drivers is coupled to a second driver gate of the number of second driver gates such that the second driver gate is shared by the more than one sub word line driver.

8. The system of claim 7, wherein each of the pull-up transistor and the pull-down transistor comprise an NMOS transistor.

9. The system of claim 7, wherein the two or more sub word line drivers are configured such that, in response to a signal via the second driver gate, each associated word line is coupled to the negative word line voltage.

10. The system of claim 7, wherein, in response to a signal via the dedicated first driver gate, an associated word line is coupled to the main word line.

11. A device, comprising:
a first word line driver including a first transistor and a second transistor, a source or drain of the first transistor coupled to a first main word line;
a second word line driver including a third transistor and a fourth transistor, a source or drain of the second transistor coupled to a second main word line;
a first driver gate coupled to a gate of the first transistor and dedicated to the first transistor;
a second driver gate coupled to a gate of the third transistor and dedicated to the third transistor; and
a third driver gate coupled to each of a gate of the second transistor and a gate of the fourth transistor.

12. The device of claim 11, wherein each of the first transistor and the third transistor comprises a pull-up transistor and each of the second transistor and the fourth transistor comprises a pull-down transistor.

13. The device of claim 11, wherein a source or a drain of the fourth transistor is coupled to a negative word line voltage source.

14. The device of claim 11, wherein a source or drain of the second transistor is coupled to a source or drain of the third transistor and a sub word line.

15. The device of claim 11, wherein, in response to receipt of a signal via the first driver gate, the first transistor conducts to couple an associated sub word line to the first main word line.

16. The device of claim 11, wherein, in response to receipt of a signal via the second driver gate, the third transistor conducts to couple an associated sub word line to the second main word line.

17. The device of claim 11, wherein a source or a drain of the second transistor of the first word line driver is coupled to a sub word line associated with the second word line driver.

18. The device of claim 11, wherein, in response to receipt of a signal via the third driver gate, a sub word line of the first word line driver is coupled to a sub word line of the second word line driver.

* * * * *

UNITED STATES PATENT AND TRADEMARK OFFICE
CERTIFICATE OF CORRECTION

| | | Page 1 of 1 |
|---|---|---|
| PATENT NO. | : 12,367,919 B2 | |
| APPLICATION NO. | : 17/544219 | |
| DATED | : July 22, 2025 | |
| INVENTOR(S) | : Christopher J. Kawamura, J. Wayne Thompson and Brenton Van Leeuwen | |

It is certified that error appears in the above-identified patent and that said Letters Patent is hereby corrected as shown below:

In the Specification

Column 9,    Line 48,    change "FXFE BWL4," to --FXFE (i.e., BWL4,--

In the Claims

Claim 2,    Column 20,    Line 23,    change "dedicated first driver" to --dedicated driver--

Signed and Sealed this
Seventh Day of October, 2025

John A. Squires
*Director of the United States Patent and Trademark Office*